(12) United States Patent
Kim et al.

(10) Patent No.: US 10,804,484 B2
(45) Date of Patent: Oct. 13, 2020

(54) LIGHTING PANEL AND METHOD OF FABRICATING THE SAME, LIGHTING MODULE, LIGHTING DEVICE, AND LIGHTING SYSTEM

(71) Applicant: LG Display Co., Ltd., Seoul (KR)

(72) Inventors: Nam-Kook Kim, Paju-si (KR); Jung-Eun Lee, Goyang-si (KR); Tae-Ok Kim, Ansan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/032,102

(22) Filed: Jul. 11, 2018

(65) Prior Publication Data
US 2019/0019978 A1 Jan. 17, 2019

(30) Foreign Application Priority Data
Jul. 11, 2017 (KR) .................... 10-2017-0088046

(51) Int. Cl.
*H01L 51/52* (2006.01)
*H01L 51/00* (2006.01)
*H01L 51/56* (2006.01)

(52) U.S. Cl.
CPC ...... *H01L 51/5212* (2013.01); *H01L 51/0097* (2013.01); *H01L 51/5253* (2013.01); *H01L 51/5268* (2013.01); *H01L 51/56* (2013.01); *H01L 51/5203* (2013.01); *H01L 51/5275* (2013.01); *H01L 2251/5338* (2013.01); *H01L 2251/5361* (2013.01); *H01L 2251/5392* (2013.01)

(58) Field of Classification Search
None
See application file for complete search history.

(56) References Cited

U.S. PATENT DOCUMENTS

2006/0113899 A1* 6/2006 Matsumoto ......... H01L 51/0002
313/504
2007/0200492 A1* 8/2007 Cok ..................... H01L 27/322
313/506

(Continued)

FOREIGN PATENT DOCUMENTS

DE 10 2015 100336 A1 7/2016
EP 2 544 080 A2 1/2013

(Continued)

OTHER PUBLICATIONS

Office Action dated Apr. 23, 2019 with English translation issued in the corresponding Japanese Patent Application No. 2018-131215, 9 Pages.

(Continued)

*Primary Examiner* — Michelle Mandala
(74) *Attorney, Agent, or Firm* — Polsinelli PC

(57) ABSTRACT

A lighting panel and method of fabricating the same, lighting module, lighting panel, and lighting system are provided. The lighting panel includes a material layer on a substrate; an auxiliary electrode embedded in the material layer; a first electrode on the material layer and electrically connected to the auxiliary electrode; an organic light-emitting layer and a second electrode in an emission portion where the first electrode is provided; and an encapsulation member in the emission portion of the substrate.

14 Claims, 23 Drawing Sheets

(56) References Cited

U.S. PATENT DOCUMENTS

| | | | |
|---|---|---|---|
| 2015/0115242 A1 | 4/2015 | Sakaguchi | |
| 2015/0303405 A1* | 10/2015 | Okumura | H01L 51/5268 257/40 |
| 2016/0020416 A1 | 1/2016 | Guimard et al. | |
| 2017/0200776 A1* | 7/2017 | Park | H01L 51/5228 |

FOREIGN PATENT DOCUMENTS

| | | |
|---|---|---|
| EP | 2 698 836 A1 | 2/2014 |
| JP | 2-66870 A | 3/1990 |
| JP | 2013521563 A | 6/2013 |
| JP | 2014096334 A | 5/2014 |
| JP | 2015535138 A | 12/2015 |
| JP | 2016509359 A | 3/2016 |
| KR | 10-2003-0077461 A | 10/2003 |
| KR | 10-2014-0116034 A | 10/2014 |
| KR | 10-2015-0002218 A | 1/2015 |
| KR | 10-2015-0095408 A | 8/2015 |
| KR | 10-2016-0144313 A | 12/2016 |
| TW | 201436329 A | 9/2014 |
| WO | 2013/153700 A1 | 10/2013 |

OTHER PUBLICATIONS

Search Report dated Nov. 30, 2018 issued in the corresponding European Patent Application No. 18182694.2, pp. 1-10.
Office Action dated Jun. 12, 2019 issued in the corresponding Taiwanese Patent Application No. 107123864 (21 pages).

\* cited by examiner

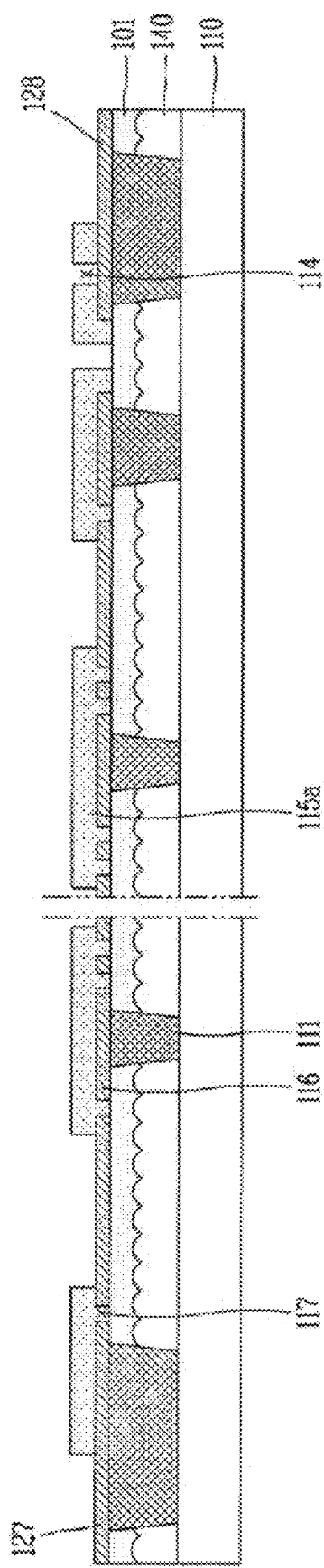
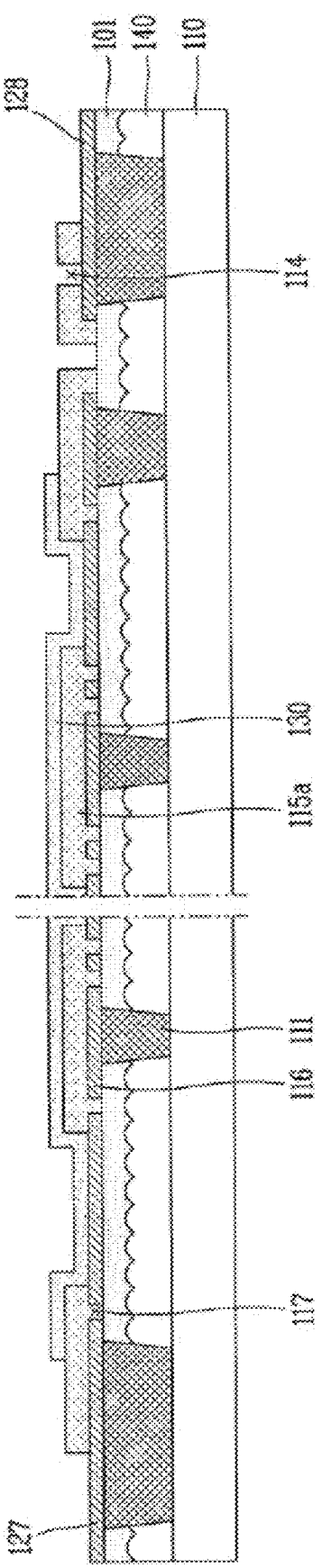
FIG. 6D
FIG. 6E

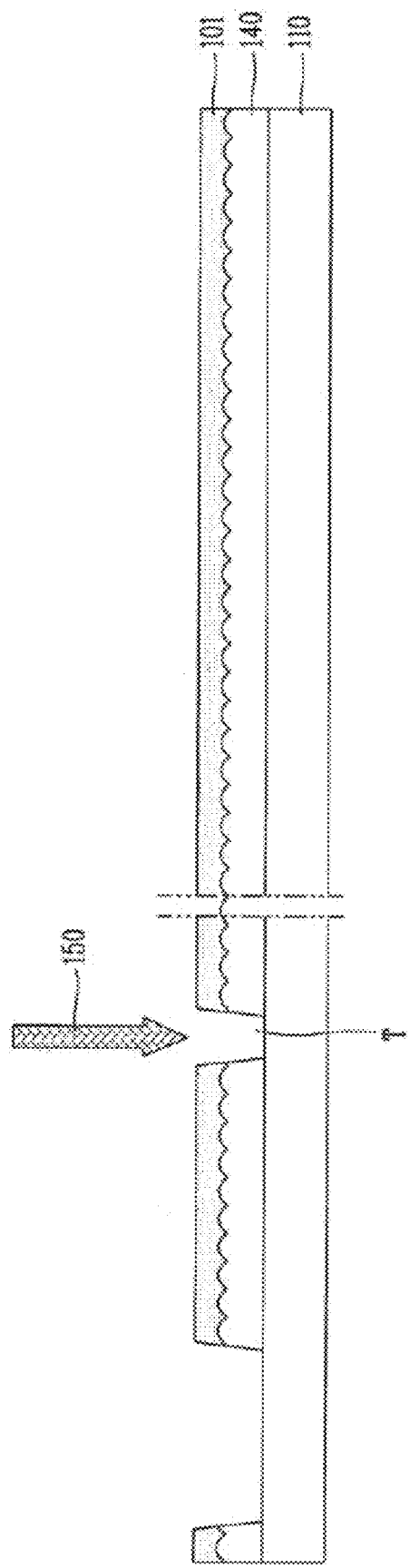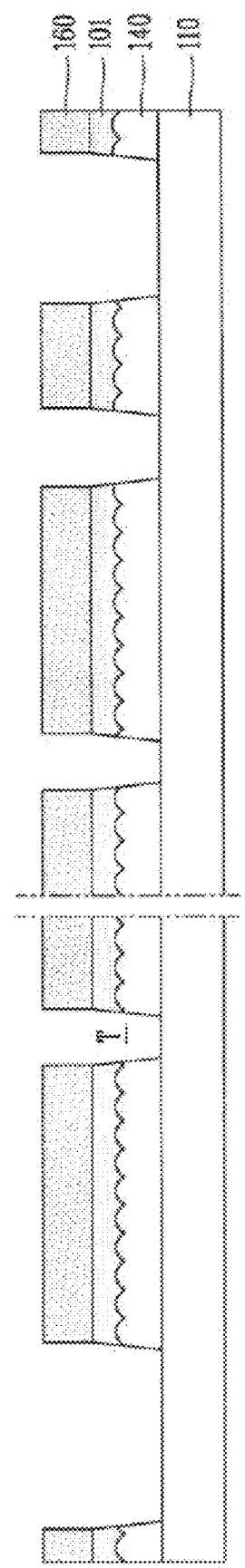
FIG. 8A
FIG. 8B

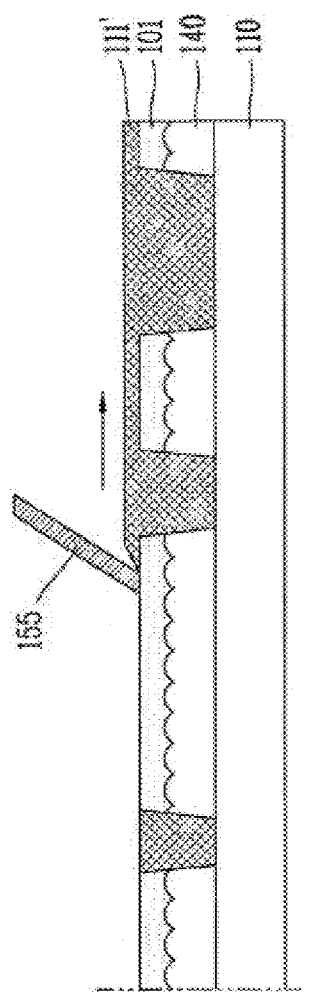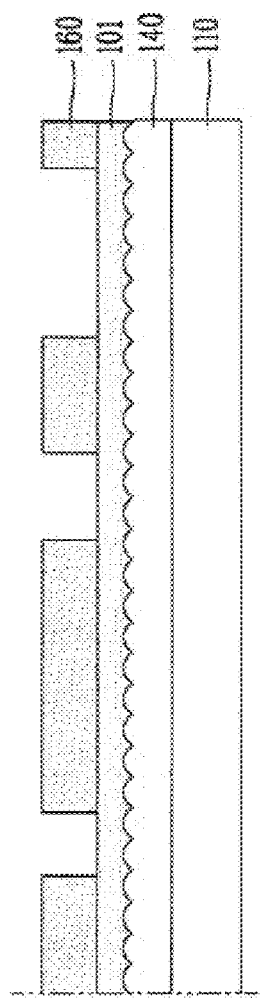
FIG. 9B
FIG. 10A

LIGHTING PANEL AND METHOD OF FABRICATING THE SAME, LIGHTING MODULE, LIGHTING DEVICE, AND LIGHTING SYSTEM

CROSS-REFERENCE TO RELATED APPLICATION

The present application claims priority from and the benefit under 35 U.S.C. § 119(a) of Korean Patent Application No. 10-2017-0088046 filed on Jul. 11, 2017, which is hereby incorporated by reference in its entirety.

BACKGROUND

Field of the Disclosure

The present disclosure relates to a lighting panel and a method of fabricating the same, lighting module, lighting panel, and lighting system, and more particularly, to a lighting panel using an organic light-emitting diode and a method of fabricating the same, lighting module, lighting panel, and lighting system.

Description of the Background

Fluorescent lamps or incandescent lamps are mainly used as current lighting devices. The incandescent lamps have good color rendering index (CRI) and very low energy efficiency. The fluorescent lamps have good energy efficiency. However, the fluorescent lamps have low CRI and also have an environmental problem because they contain mercury.

The color rendering index is an index representing a degree of color reproduction. The color rendering index is an index showing how similar feelings of colors of an object illuminated by light sources are by comparing a case where the object is illuminated by a specific light source and a case where the object is illuminated by a reference light source. For example, the CRI of sunlight is 100.

In order to solve the problem of this conventional lighting device, a light-emitting diode (LED) has recently been proposed as a lighting device. The light-emitting diode is formed of an inorganic light-emitting material. Its luminous efficiency is the highest in the blue wavelength range, and the luminous efficiency is lowered toward the red wavelength range and the green wavelength range having the highest visibility. Therefore, when white light is emitted by combining a red light-emitting diode, a green light-emitting diode, and a blue light-emitting diode, there is a problem that the luminous efficiency can be lowered.

As an alternative, a lighting panel using an organic light-emitting diode (OLED) has been developed. In a lighting panel using the conventional organic light-emitting device, an anode electrode of ITO is formed on a glass substrate. Then, an organic light-emitting layer and a cathode electrode are formed, and a passivation layer and a lamination film of an encapsulation member are adhered thereon.

In the lighting panel using an organic light-emitting diode, an auxiliary electrode is formed for uniform brightness of the lighting panel emitting planar light. At this time, after laminating the encapsulation member, the passivation layer and the cathode can be cracked due to a high taper of the auxiliary electrode.

FIG. 1 is a picture showing a taper of an auxiliary electrode and a stack structure thereon in the related art.

At this time, FIG. 1 shows a taper of an auxiliary electrode including a double layer of Mo/Al and a stack structure thereon as an example.

Referring to FIG. 1, the auxiliary electrode including a double layer of Mo/Al has a high taper of 70 degrees or more, for example, of 80 degrees.

At this time, as the taper of the auxiliary electrode gets higher, there is high possibility that a crack occurs in a passivation layer and a cathode on the auxiliary electrode when an encapsulation member is laminated. More particularly, a step is formed due to the high taper of the auxiliary electrode, and the crack occurs in crack weak points by physical pressure when the encapsulation member is laminated.

This crack may form a penetration path of moisture from an edge of a panel, and a dark spot may be caused during operation of the panel, thereby reducing the reliability of the panel.

SUMMARY OF THE DISCLOSURE

Accordingly, the present disclosure is directed to a lighting panel and a method of fabricating the same, lighting module, lighting panel, and lighting system that substantially obviates one or more of the problems due to limitations and disadvantages of the related art.

An object of the present disclosure is to provide a lighting panel and a method of fabricating the same, lighting module, lighting panel, and lighting system of preventing a passivation layer and a cathode from being cracked due to a step and taper of an auxiliary electrode.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided a lighting panel using an organic light-emitting diode, comprising: a material layer on a substrate; an auxiliary electrode embedded in the material layer; a first electrode on the material layer and electrically connected to the auxiliary electrode; an organic light-emitting layer and a second electrode in an emission portion where the first electrode is provided; and an encapsulation member in the emission portion of the substrate.

In another aspect, there is provided a lighting module comprising the lighting panel according to any aspects of the present disclosure.

In another aspect, there is provided a lighting device comprising at least one of the lighting panel and the lighting module according to aspects of the present disclosure.

In another aspect, there is provided a lighting system comprising at least one of the lighting panel, the lighting module and the lighting device according to aspects of the present disclosure.

In another aspect, there is provided a method of fabricating a lighting panel using an organic light-emitting diode includes forming an inner light extraction layer and/or a buffer layer on a substrate; forming an auxiliary electrode pattern having a depressed shape in the inner light extraction layer and/or the buffer layer by selectively removing the inner light extraction layer and/or the buffer layer; embedding an auxiliary electrode in the auxiliary electrode pattern;

forming a first electrode on the buffer layer and electrically connected to the auxiliary electrode; forming an organic light-emitting layer and a second electrode in an emission portion where the first electrode is provided; and forming an encapsulation member in the emission portion of the substrate.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate aspects of the present disclosure and together with the description serve to explain the principles of the present disclosure. In the drawings:

FIGS. 6A to 6G are cross-sectional views sequentially illustrating a method of fabricating a lighting panel using an organic light-emitting diode according to the first aspect of the present disclosure shown in FIG. 4;

FIGS. 8A to 8C are cross-sectional views specifically illustrating a method of forming the auxiliary electrode shown in FIG. 6B;

FIGS. 9A and 9B are cross-sectional views specifically illustrating another method of forming the auxiliary electrode shown in FIG. 6B;

FIGS. 10A to 10C are cross-sectional views specifically illustrating another method of forming the auxiliary electrode shown in FIG. 6B;

DETAILED DESCRIPTION OF THE ASPECTS

Figure 1:
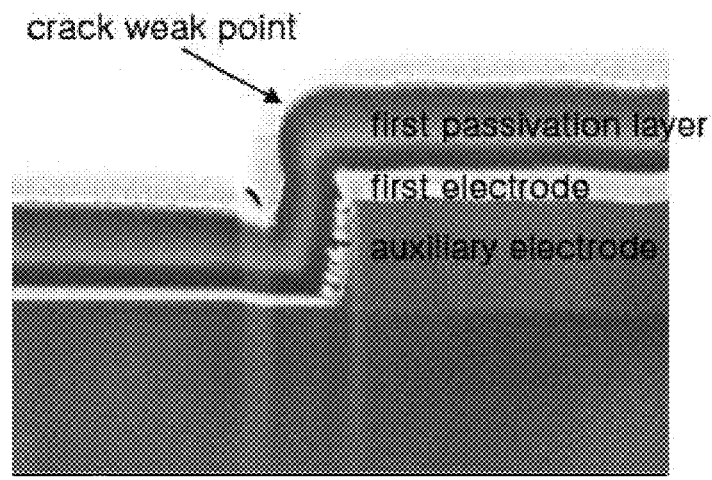
FIG. 1 is a picture of showing a taper of an auxiliary electrode and a stack structure thereon in the related art.

Hereinafter, a lighting panel using an organic light-emitting diode and a method of fabricating the same according to exemplary aspects of the present disclosure will be described with reference to the accompanying drawings.

Advantages and features of the present disclosure and methods of accomplishing the same will be clearly understood with reference to the following aspects described in detail in conjunction with the accompanying drawings. However, the present disclosure is not limited to those aspects disclosed below but may be implemented in various different forms. It should be noted that the present aspects are merely provided to make a full disclosure and also to allow those skilled in the art to know the full range of the disclosure, and therefore, the present disclosure is to be defined only by the scope of the appended claims. Further, like reference numerals refer to like or similar elements throughout the specification. In the drawings, the size and relative size of layers and regions may be exaggerated for the clarity of the description.

An element or layer referred to as being "on" another element or layer may include both a case where it is directly on the another element or layer and a case where another element and layer is interposed therebetween. On the contrary, an element referred to as being "directly on" another element indicates a case where another element and layer is not interposed therebetween.

Spatially relative terms such as "below", "beneath", "lower", "above", or "upper" may be used herein to describe a correlation between one device or constituent element and other devices or constituent elements as illustrated in the drawings. It will be understood that spatially relative terms are intended to include a different direction of device during the use or operation in addition to its direction illustrated in the drawings. For example, when a device in the drawing is turned over, the device described as "below" or "beneath" another device will be placed "above" the another device. Accordingly, the exemplary terms "below" or "beneath" may include both directions of above and below. Since the device may be oriented in another direction, and thus the spatially relative terms may be interpreted in accordance with the orientation thereof.

It should be noted that the terms used herein are merely used to describe the aspects, but not to limit the present disclosure. In the present specification, unless clearly used otherwise, expressions in a singular form include a plural form. The term "comprises" and/or "comprising" used in the specification intend to express a constituent element, a step, an operation and/or a device does not exclude the existence or addition of one or more other constituent elements, steps, operations and/or devices.

Figure 2:
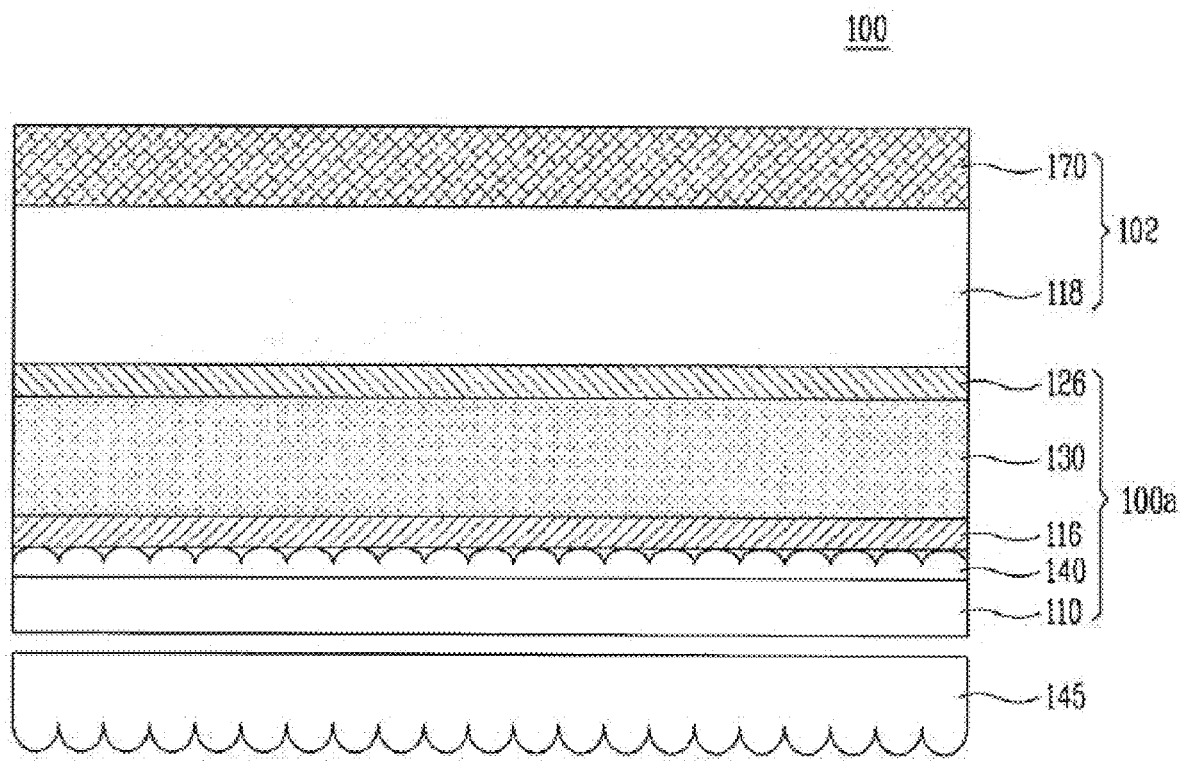
FIG. 2 is a cross-sectional view showing a lighting panel using an organic light-emitting diode according to a first aspect of the present disclosure.

FIG. 2 is a cross-sectional view showing a lighting panel using an organic light-emitting diode according to a first aspect of the present disclosure.

Figure 3:
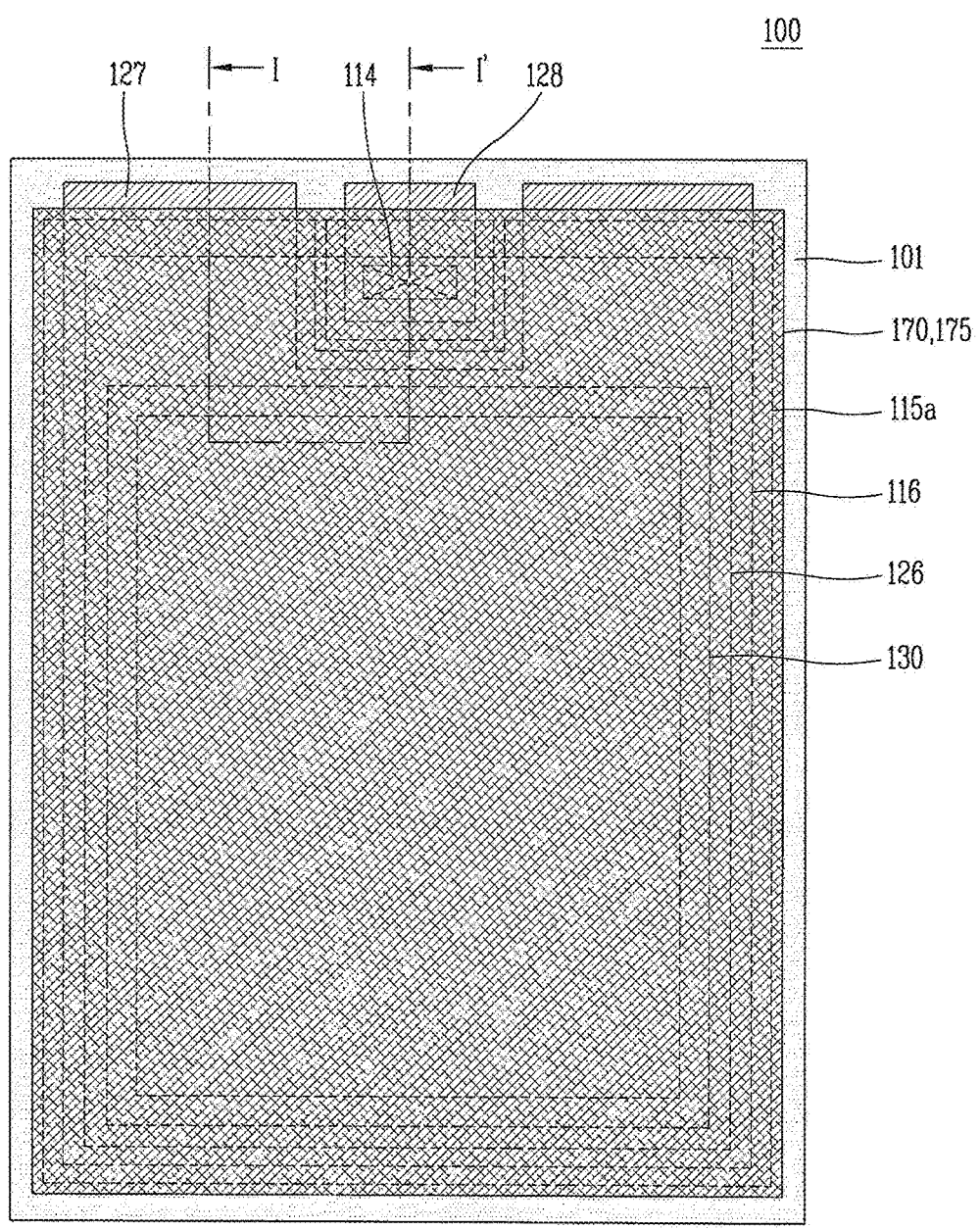
FIG. 3 is a plan view schematically showing a lighting panel using an organic light-emitting diode according to the first aspect of the present disclosure.

FIG. 3 is a plan view schematically showing a lighting panel using an organic light-emitting diode according to the first aspect of the present disclosure.

Figure 4:
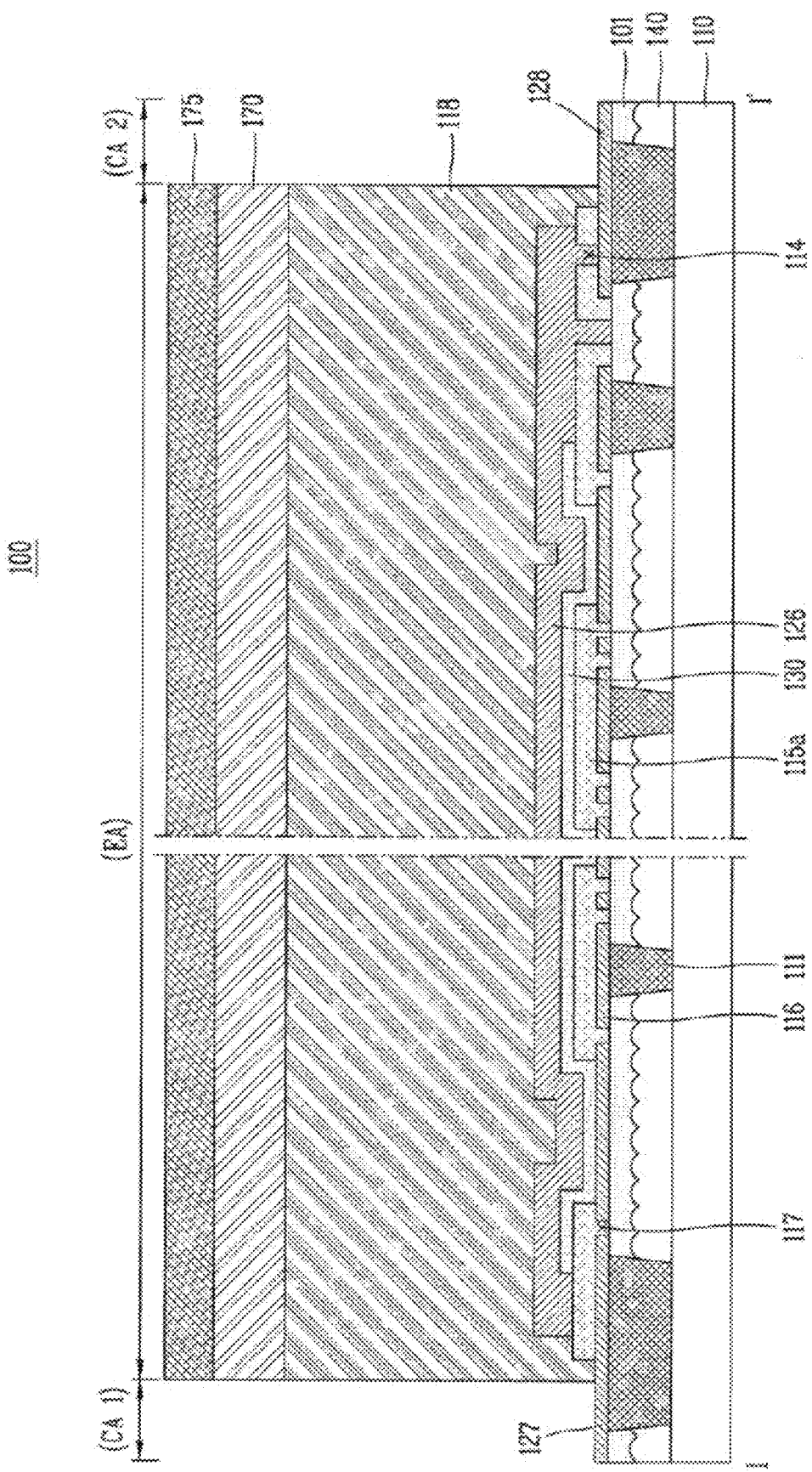
FIG. 4 is a view schematically showing a cross-section of a lighting panel using an organic light-emitting diode according to the first aspect taken along the line I-I' in FIG. 3.

FIG. 4 is a view schematically showing a cross-section of a lighting panel using an organic light-emitting diode according to the first aspect taken along line I-I' in FIG. 3.

The present disclosure provides a lighting panel using an organic light-emitting diode made of an organic material instead of an inorganic light-emitting diode made of an inorganic material.

The organic light-emitting diode made of an organic light-emitting material has relatively good luminous efficiency of green and red as compared with the inorganic light-emitting diode. In addition, since the organic light-emitting diode have the emission peak of red, green and blue with a relatively wide width as compared with the inorganic light-emitting diode, the organic light-emitting diode has an advantage that the color rendering index (CRI) is improved and light of a light-emitting device is more similar to the sunlight.

In the following description, the lighting panel of the present disclosure is described as a flexible lighting panel having flexibility. However, the present disclosure can be applied to a general lighting panel that is not bendable as well as to a flexible lighting panel.

Referring to FIGS. 2 to 4, the lighting panel 100 using an organic light-emitting diode according to the first aspect of the present disclosure may include an organic light-emitting diode unit 100a for emitting planar light and an encapsulation unit 102 for encapsulating the organic light-emitting diode unit 100a.

At this time, an external light extraction (or outcoupling) layer 145 may be further provided under the organic light-emitting diode unit 100a to increase the haze. However, the present disclosure is not limited thereto, and an external light extraction layer may not be provided.

The external light extraction layer 145 may be formed of scattering particles of $TiO_2$ or the like dispersed in a resin and may be attached to a lower portion of a substrate 110 through an adhesive layer (not shown).

The organic light-emitting diode unit 100a includes an organic light-emitting diode provided on the substrate 110. At this point, an internal light extraction layer 140 may be further provided between the substrate 110 and the organic light-emitting diode. However, the present disclosure is not limited thereto, and an internal light extraction layer may not be provided.

The internal light extraction layer 140 may be formed of scattering particles of $TiO_2$, $ZrO_2$ or the like dispersed in a resin, but the present disclosure is not limited thereto.

A buffer layer 101 may be further provided on the internal light extraction layer 140.

At this time, the substrate 110 may include an emission portion EA that actually emits light and outputs the light to the outside and contact portions CA1 and CA2 that are electrically connected to the outside through contact electrodes 127 and 128 to apply a signal to the emission portion EA.

The contact portions CA1 and CA2 may not be covered by an encapsulation member of a metal film 170 and/or a protection film 175 and may be electrically connected to the outside through the contact electrodes 127 and 128. Therefore, the metal film 170 and/or protection film 175 may be attached to an entire surface of the emission portion EA of the substrate 110 excluding the contact portions CA1 and CA2. However, the present disclosure is not limited thereto.

At this time, the contact portions CA1 and CA2 may be located outside the emission portion EA. FIG. 3 shows that a second contact portion CA2 including the contact electrode 128 is disposed between first contact portions CA1 including the contact electrode 127 as an example, but the present disclosure is not limited thereto.

In addition, FIG. 3 illustrates that the contact portions CA1 and CA2 are located only at one side of the emission portion EA, but the present disclosure is not limited thereto. Accordingly, the contact portions CA1 and CA2 of the present disclosure may be disposed both at upper and lower sides of the emission portion EA.

A first electrode 116 and a second electrode 126 may be disposed on the substrate 110, and an organic light-emitting layer 130 may be disposed between the first electrode 116 and the second electrode 126, thereby forming the organic light-emitting diode. In the lighting panel 100 having the above structure, the organic light-emitting layer 130 emits light by applying currents to the first electrode 116 and the second electrode 126 of the organic light-emitting diode, and light is outputted through the emission portion EA.

The organic light-emitting layer 130 may be a light-emitting layer that outputs white light. For example, the organic light-emitting layer 130 may include a blue light-emitting layer, a red light-emitting layer and a green light-emitting layer or may have a tandem structure including a blue light-emitting layer and a yellow-green light-emitting layer. However, the organic light-emitting layer 130 of the present disclosure is not limited to the above-described structure, and various structures may be applied.

Moreover, the organic light-emitting layer 130 of the present disclosure may further include an electron injection layer and a hole injection layer for injecting electrons and holes into the light-emitting layer, respectively, an electron transport layer and a hole transport layer for transporting the injected electrons and holes to the light-emitting layer, respectively, and a charge generation layer for generating charges such as electrons and holes.

At this time, a first passivation layer 115a, the organic light-emitting layer 130 and the second electrode 126 are not formed in the contact portions CA1 and CA2 outside the emission portion EA, and the contact electrodes 127 and 128 may be exposed to the outside.

At this time, although not shown in the figures, a second passivation layer of an organic material and a third passivation layer of an inorganic material may be formed in the emission portion EA so as to cover the organic light-emitting layer 130 and the second electrode 126.

Generally, when a polymer constituting an organic light-emitting material is combined with moisture, luminescent characteristics are rapidly deteriorated, and the luminous efficiency of the organic light-emitting layer 130 is lowered. Particularly, when a part of the organic light-emitting layer 130 is exposed to the outside, the moisture is propagated into the lighting panel 100 along the organic light-emitting layer 130 to thereby lower the luminous efficiency of the lighting panel 100. Accordingly, in the present disclosure, the second passivation layer and the third passivation layer are formed to cover the organic light-emitting layer 130 and the second electrode 126 of the emission portion EA, and thus moisture is prevented from permeating through the organic light-emitting layer 130 of the emission portion EA of the lighting panel 100 where light is actually emitted and outputted. Therefore, the yield is improved, the manufacturing costs are reduced, and the reliability is secured.

As described above, the first electrode 116 including the first contact electrode 127 and the second contact electrode 128 are disposed on the substrate 110 of a transparent material. The substrate 110 may be formed of a rigid material such as glass. However, by using a material having flexibility such as plastic, it is possible to manufacture the lighting panel 100 which can be bent. Moreover, in the present disclosure, by using a plastic material having flexibility as the substrate 110, it is possible to perform a process using a roll, thereby manufacturing the lighting panel 100 quickly.

The first electrode 116 including the first contact electrode 127 and the second contact electrode 128 may be disposed in the emission portion EA and the first and second contact portions CA1 and CA2 and may be formed of a transparent conductive material having relatively high conductivity and high work function. For example, the first electrode 116 including the first contact electrode 127 and the second contact electrode 128 may be formed of a tin oxide conductive material such as indium tin oxide (ITO) or a zinc oxide conductive material such as indium zinc oxide (IZO) or may be formed of a transparent conductive polymer.

At this time, in the present disclosure, a short reduction pattern 117 is formed in the first electrode 116 for providing each pixel with currents to reflect a narrow path, and the first passivation layer 115a covers the short reduction pattern 117 to prevent occurrence of a short circuit. That is, the short reduction pattern 117 is formed so as to surround the periphery of an emission area of each pixel, and a resistance is added to each pixel, thereby limiting the currents flowing to a short-circuit occurrence region.

The first electrode 116 may extend to the first contact portion CA1 outside the emission portion EA and may constitute the first contact electrode 127. The second contact electrode 128 may be disposed in the second contact portion CA2 and may be electrically insulated from the first electrode 116. Namely, the second contact electrode 128 may be disposed in the same layer as the first electrode 116 and may be electrically isolated from the first electrode 116.

As an example, FIG. 3 shows that the first electrode 116 including the first contact electrode 127 has a rectangular shape as a whole and includes an upper center portion, which is removed to form a recession, and the second contact electrode 128 is disposed in the recession. However, the present disclosure is not limited thereto.

An auxiliary electrode 111 may be disposed in the emission portion EA and the first contact portion CA1 on the substrate 110 and may be electrically connected to the first electrode 116 and the first contact electrode 127. Since the first electrode 116 is formed of a transparent high resistance conductive film, the first electrode 116 has an advantage of light transmission and also has a disadvantage of very high electrical resistance as compared with an opaque metal. Therefore, when a large area lighting panel 100 is manufactured, distribution of currents applied to a large emission area is not uniform due to the high resistance of the transparent high resistance conductive film, and this non-uniform current distribution makes it difficult that the large area lighting panel 100 emits light of uniform brightness.

The auxiliary electrode 111 is arranged in a shape of a mesh with a thin width, a hexagon, an octagon or a circle all over the emission portion EA such that uniform currents can be applied to the first electrode 116 all over the emission portion EA and the large area lighting panel 100 can emit light of uniform brightness.

FIG. 4 shows that the auxiliary electrode 111 is disposed under the first electrode 116 including the first contact electrode 127 and is embedded in the internal light extraction layer 140 and the buffer layer 101 as an example, but the present disclosure is not limited thereto. The auxiliary electrode 111 may be embedded only in one of the internal light extraction layer 140 and the buffer layer 101. In addition, the auxiliary electrode 111 of the present disclosure may be embedded up to a thickness of the internal light extraction layer 140 and/or the buffer layer 101 or may be embedded up to a part of the thickness of the internal light extraction layer 140 and/or the buffer layer 101. In the present disclosure, it is also possible to further form a specific layer of an inorganic film for embedding the auxiliary electrode 111.

At this time, in FIG. 4, as an example, the auxiliary electrode 111 is embedded with a reversed taper in the internal light extraction layer 140 and the buffer layer 101, but the present disclosure is not limited thereto. The auxiliary electrode 111 may be embedded with a taper of substantially 90 degrees. Here, the reversed taper means that an upper part of the auxiliary electrode 111 embedded in the internal light extraction layer 140 and the buffer layer 101 has a wider width than a lower part thereof. Accordingly, when the auxiliary electrode 111 has a taper of 90 degrees, the width of the upper part is substantially equal to the width of the lower part.

The auxiliary electrode 111 according to the present disclosure may be embedded in the same layer or the lower layer without protruding above the internal light extraction layer 140 and/or the buffer layer 101.

When the auxiliary electrode 111 is embedded in the internal light extraction layer 140 and/or the buffer layer 101, a step is not formed between the auxiliary electrode 111 and the upper layer, and it is prevented that the passivation layers (i.e., the first, second and third passivation layers 115a) and a cathode (i.e., the second electrode 126) are cracked. As a result, the effect of improving the reliability of the lighting panel can be provided.

At this time, the auxiliary electrode 111 disposed in the first contact portion CA1 is used as a transmission path for the currents to the first electrode 116 through the first contact electrode 127. The auxiliary electrode 111 may contact the outside and may serve as a contact electrode for applying currents from the outside to the first electrode 116.

The auxiliary electrode 111 may be formed of a conductive metal such as Al, Au, Cu, Ti, W, Mo or an alloy thereof. The auxiliary electrode 111 may have a two-layer structure of an upper auxiliary electrode and a lower auxiliary electrode, but the present disclosure is not limited thereto. The auxiliary electrode 111 may be formed of a single layer.

The first passivation layer 115a may be formed in the emission portion EA of the substrate 110. In FIG. 3, the first passivation layer 115a is shown as rectangular frame shape having a uniform width as a whole. In practice, the first passivation layer 115a may be removed in a light-emitting region and may be formed in a shape of a mesh so as to cover the auxiliary electrode 111, which is arranged in a shape of a mesh. However, the present disclosure is not limited thereto.

The first passivation layer 115a disposed in the emission portion EA may be formed to cover the auxiliary electrode 111 and the first electrode 116 thereon. The first passivation layer 115a is not formed in the light-emitting region where light is actually emitted.

The first passivation layer 115a may be formed of an inorganic material such as SiOx or SiNx. However, the first passivation layer 115a may be formed of an organic material such as photo acryl or may be composed of a plurality of layers of an inorganic material and an organic material.

In addition, the organic light-emitting layer 130 and the second electrode 126 may be disposed on the substrate 110 on which the first electrode 116 and the first passivation layer 115a are disposed. At this time, the first passivation layer 115a on the second contact electrode 128 in the emission portion EA may be partially removed and may have a contact hole 114 exposing the second contact electrode 128. Accordingly, the second electrode 126 may be electrically connected to the second contact electrode 128 thereunder through the contact hole 114.

As described above, the organic light-emitting layer 130, as a white light-emitting layer, may include a blue light-emitting layer, a red light-emitting layer and a green light-emitting layer or may have a tandem structure including a blue light-emitting layer and a yellow-green light-emitting layer. In addition, the organic light-emitting layer 130 may further include an electron injection layer and a hole injection layer for injecting electrons and holes into the light-emitting layer, respectively, an electron transport layer and a hole transport layer for transporting the injected electrons and holes to the light-emitting layer, respectively, and a charge generation layer for generating charges such as electrons and holes.

The second electrode 126 may be formed of a material having relatively low work function such that electrons are easily injected to the organic light-emitting layer 130. Specific examples of a material used as the second electrode 126 may include a metal such as magnesium, calcium, sodium, titanium, indium, yttrium, lithium, gadolinium, aluminum, silver, tin and lead or an alloy thereof.

The first electrode 116, the organic light-emitting layer 130 and the second electrode 126 of the emission portion EA constitute the organic light-emitting diode. At this time, the first electrode 116 is an anode of the organic light-emitting diode, and the second electrode 126 is a cathode of organic light-emitting diode. When currents are applied to the first electrode 16 and the second electrode 126, electrons are injected from the second electrode 126 into the organic light-emitting layer 130, and holes are injected from the first electrode 116 into the organic light-emitting layer 130. After this, excitons are generated in the organic light-emitting layer 130, and light corresponding to an energy difference between the LUMO (lowest unoccupied molecular orbital) and the HOMO (highest occupied molecular orbital) of the light-emitting layer is emitted to a lower direction (toward the substrate 110 in the figure) as the excitons decay.

At this time, although not shown in the figures, the second passivation layer and the third passivation layer may be provided on the substrate 110 on which the second electrode 126 is formed.

The second passivation layer according to the first aspect of the present disclosure, as described above, may be formed to cover the organic light-emitting layer 130 and the second electrode 126 of the emission portion EA and may prevent moisture from penetrating into the organic light-emitting layer 130 of the emission portion EA.

That is, in the present disclosure, the second passivation layer and the third passivation layer are formed to cover the organic light-emitting layer 130 and the second electrode 126 of the emission portion EA in addition to an adhesive 118 and the encapsulation member of the metal film 170, and it is possible to prevent moisture from penetrating into the organic light-emitting layer 130 of the emission portion EA of the lighting panel 100 where light is actually emitted and outputted.

The second passivation layer may be formed of an organic material such as photo acryl. In addition, the third passivation layer may be formed of an inorganic material such as SiOx or SiNx. However, the present disclosure is not limited thereto.

A predetermined encapsulant may be provided on the third passivation layer, and an epoxy compound, an acrylate compound, an acrylic compound, or the like may be used as the encapsulant.

As described above, the first contact electrode 127 extending from the first electrode 116 is exposed to the outside on the substrate 110 of the first contact portion CAL The second contact electrode 128 electrically connected to the second electrode 126 through the contact hole 114 is exposed to the outside on the substrate 110 of the second contact portion CA2. Accordingly, the first contact electrode 127 and the second contact electrode 128 are electrically connected to an external power source, so that currents can be applied to the first electrode 116 and the second electrode 126, respectively.

An adhesive 118 such as PSA (pressure sensitive adhesive) is applied on the third passivation layer, the metal film 170 is disposed thereon, and the metal film 170 is attached to the third passivation layer, so that the lighting panel 100 can be encapsulated.

At this time, the adhesive 118 and the encapsulation member of the metal film 170 can be attached so as to sufficiently cover the second passivation layer and the third passivation layer.

In addition, a predetermined protection film 175 may be disposed thereon and attached to an entire surface of the emission portion EA of the substrate 110 excluding the contact portions CA1 and CA2.

The adhesive 118 may be a photo-curable adhesive or a thermosetting adhesive.

Hereinafter, a method of fabricating a lighting panel using an organic light-emitting diode according to the first aspect of the present disclosure with reference to the drawings.

FIGS. 5A to 5G are plan views sequentially illustrating a method of fabricating a lighting panel using an organic light-emitting diode according to the first aspect of the present disclosure shown in FIG. 3.

FIGS. 6A to 6G are cross-sectional views sequentially illustrating a method of fabricating a lighting panel using an organic light-emitting diode according to the first aspect of the present disclosure shown in FIG. 4.

Figure 5A:
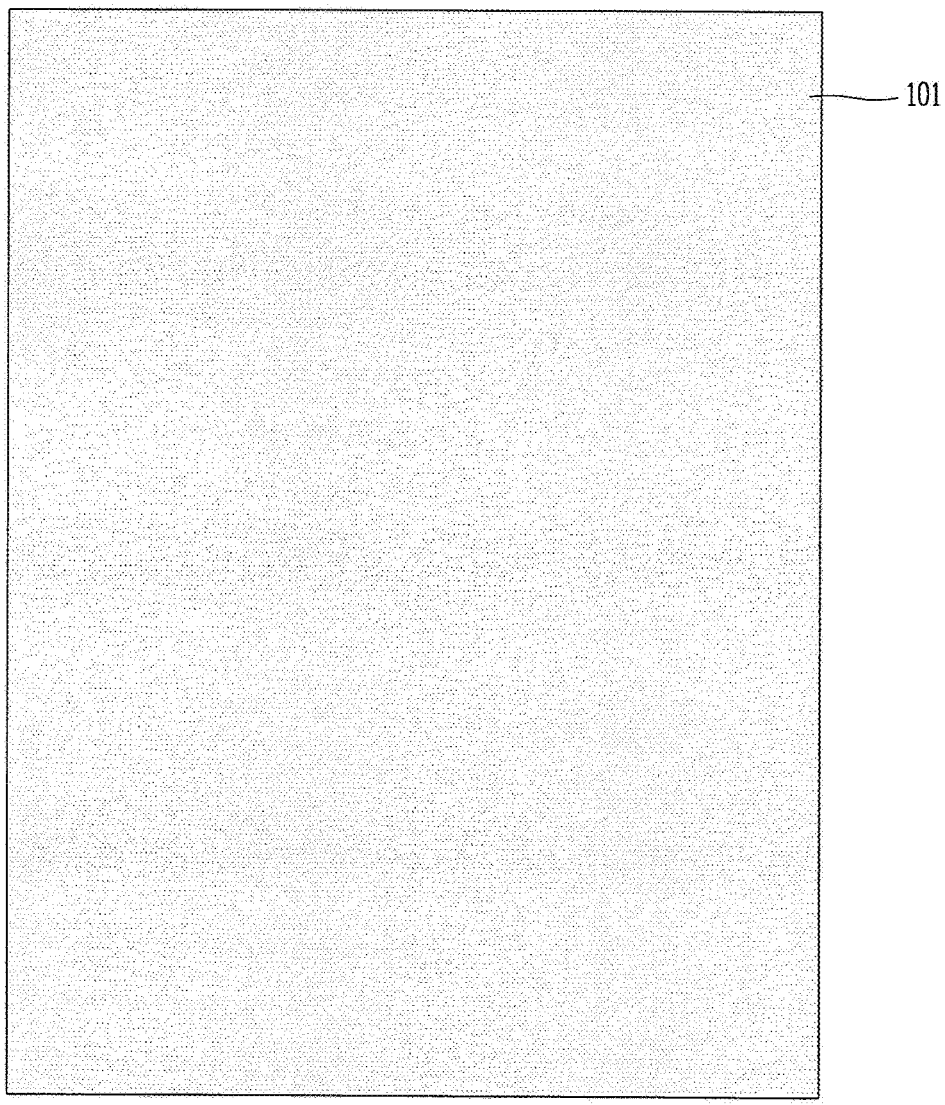
FIGS. 5A to 5G are plan views sequentially illustrating a method of fabricating a lighting panel using an organic light-emitting diode according to the first aspect of the present disclosure shown in FIG. 3.
Figure 5B:
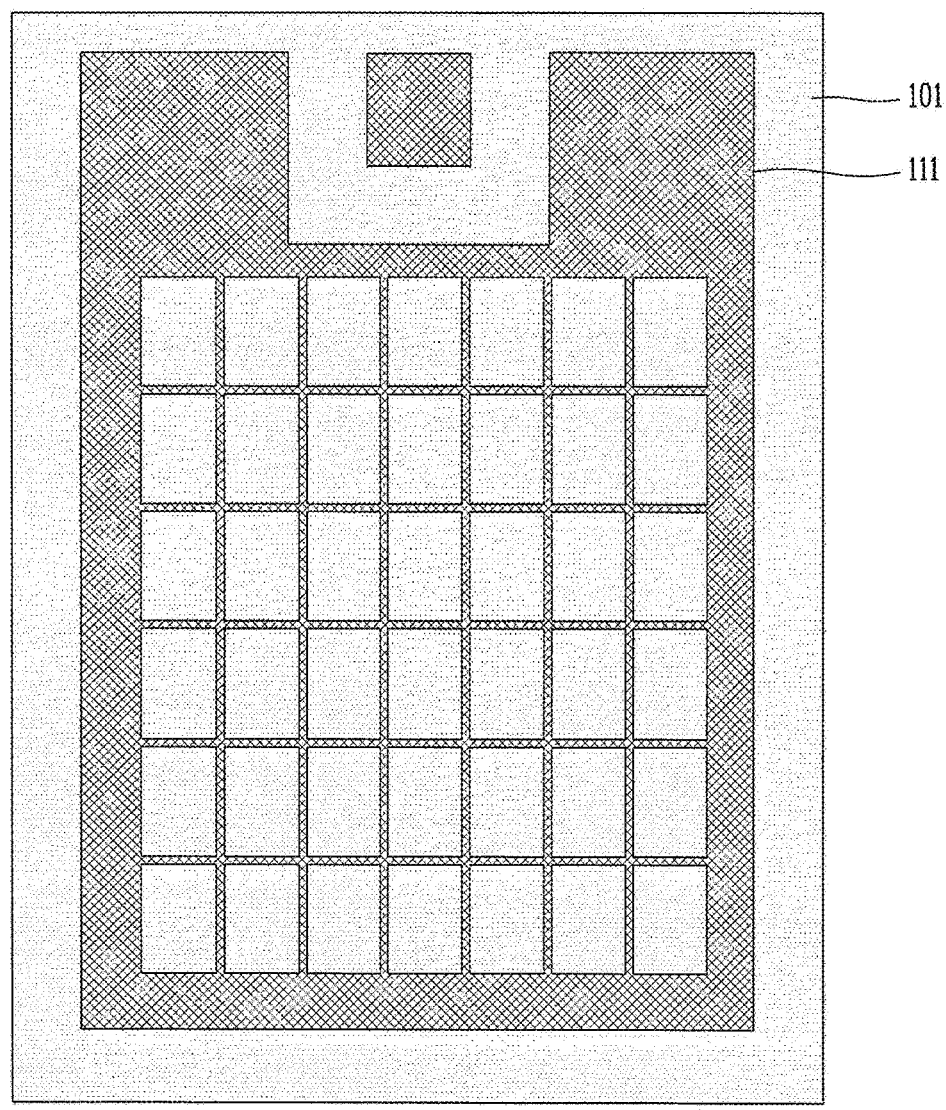
Figure 5C:
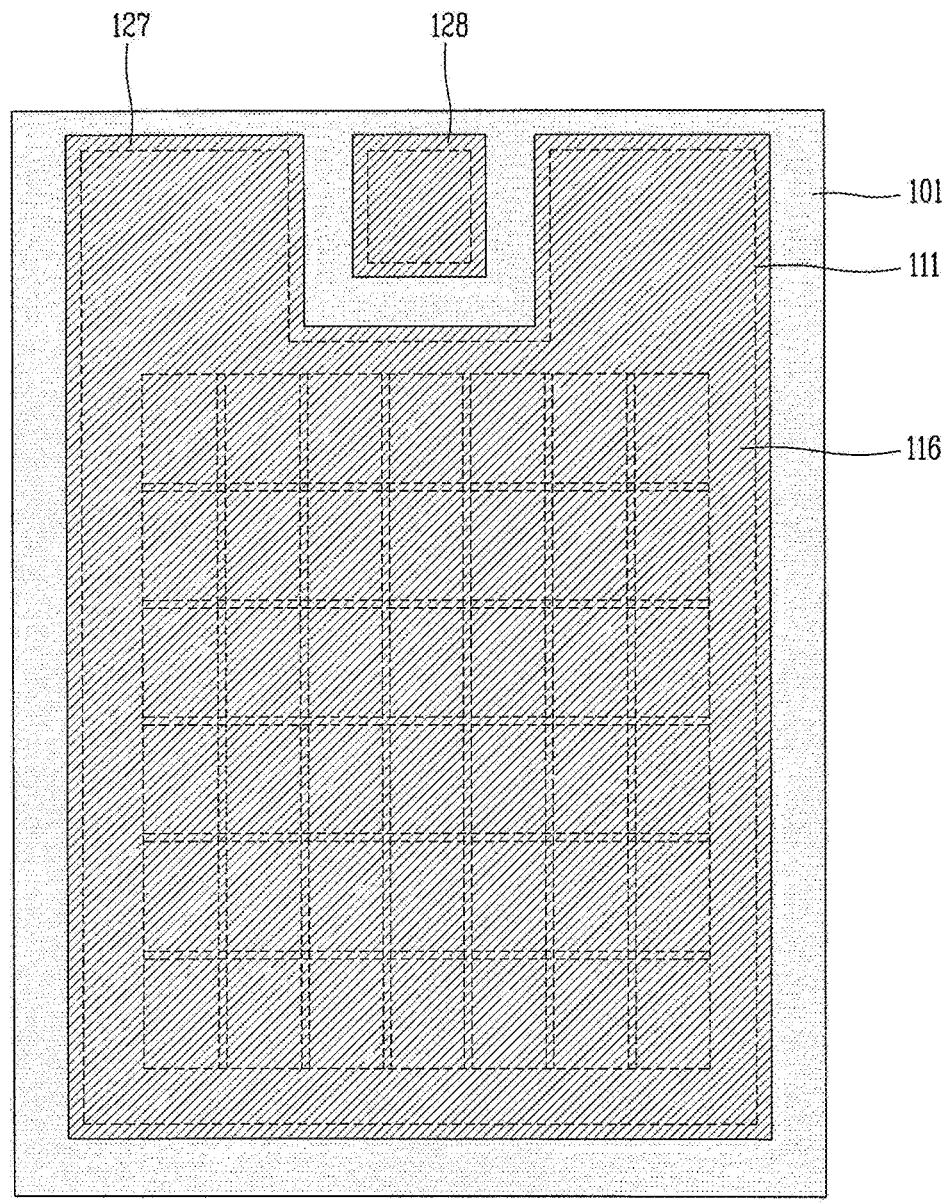
Figure 5D:
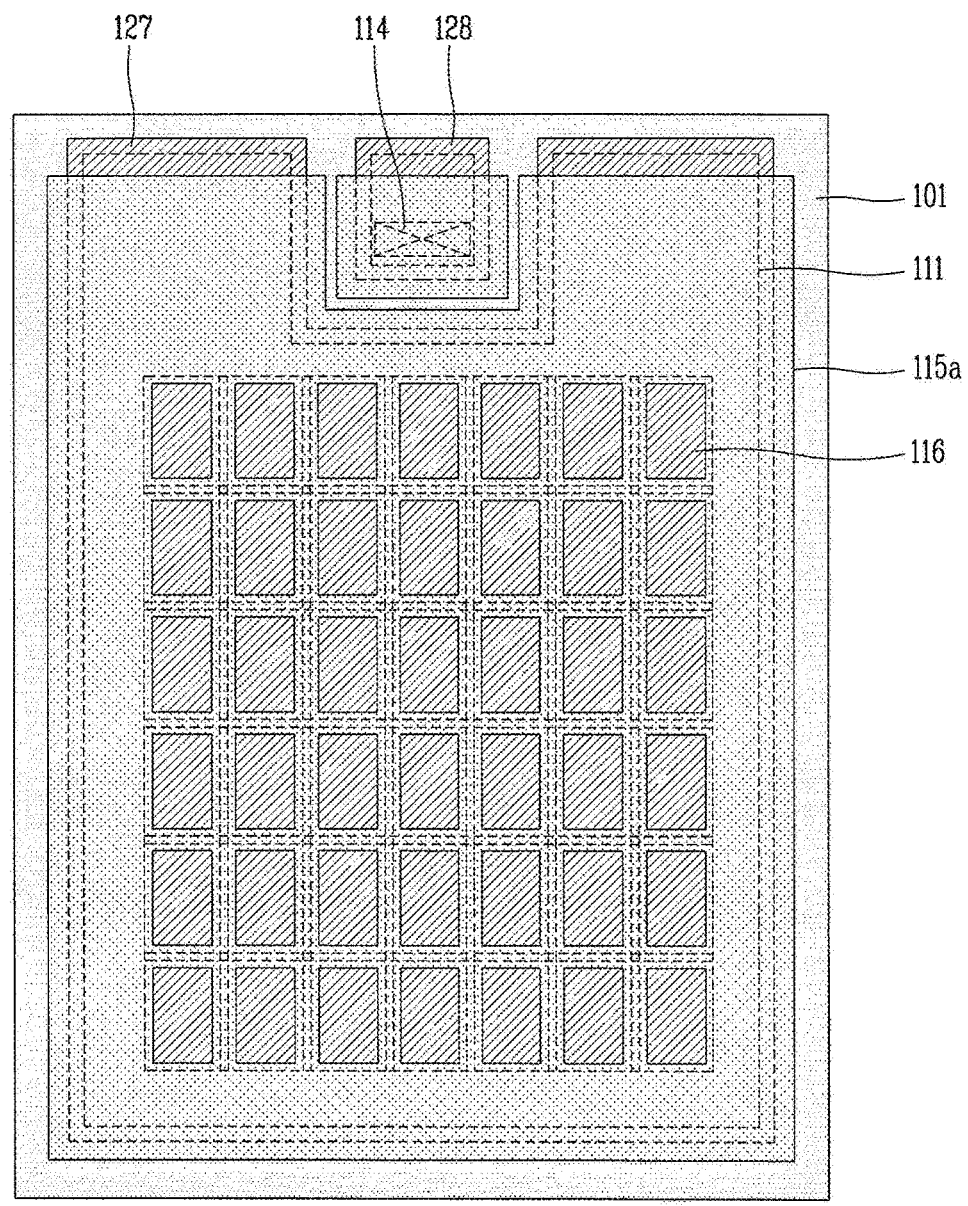
Figure 7:
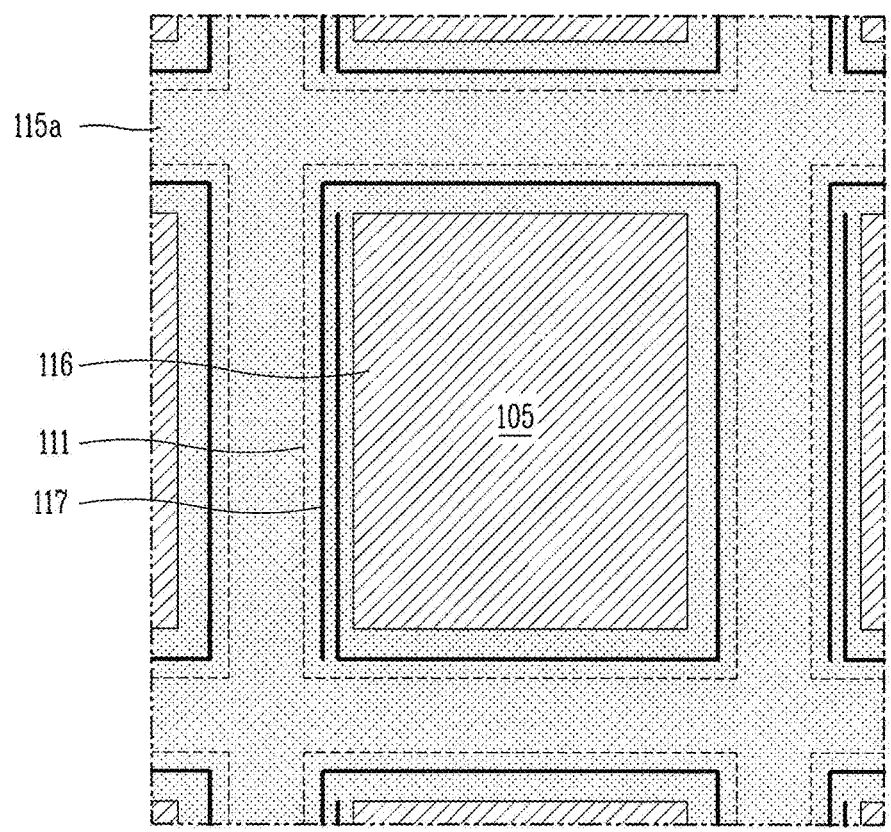
FIG. 7 is a view enlarging a part of an emission portion shown in FIG. 5D.

FIG. 7 is a view enlarging a part of an emission portion shown in FIG. 5D.

Figure 6A:
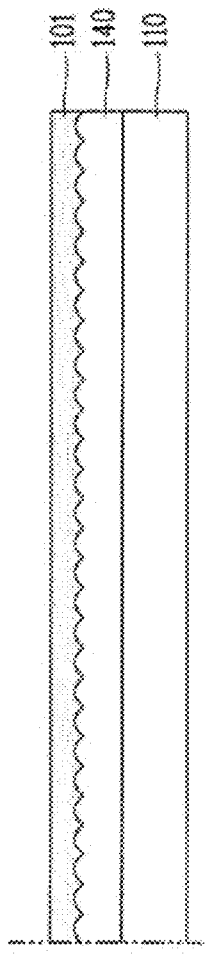

First, referring to FIG. 5A and FIG. 6A, an internal light extraction layer 140 is formed on a substantially entire surface of a substrate 110. However, the present disclosure is not limited thereto, and an internal light extraction layer may not be formed.

At this time, the internal light extraction layer 140 may be formed of scattering particles of $TiO_2$, $ZrO_2$, or the like dispersed in a resin, and the present disclosure is not limited thereto.

A buffer layer 101 may be further provided on the internal light extraction layer 140.

At this point, the substrate 110 may include an emission portion for actually emitting and outputting light to the outside and a contact portion for electrically connecting with the outside through a contact electrode and applying signals to the emission portion.

Figure 6B:
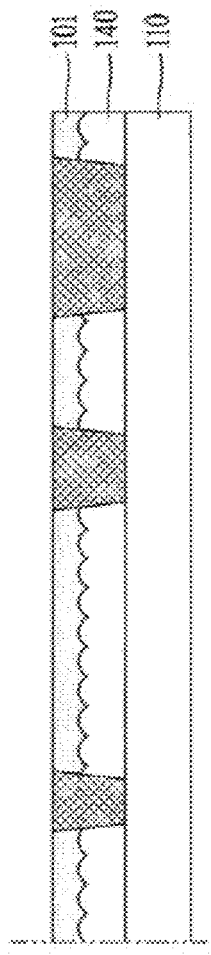

Next, referring to FIG. 5B and FIG. 6B, the internal light extraction layer 140 and/or the buffer layer 101 are partially removed, and a conductive material is deposited and embedded in a removed part to thereby form a predetermined auxiliary electrode 111.

As described above, the auxiliary electrode 111 according to the first aspect of the present disclosure is embedded in the internal light extraction layer 140 and the buffer layer 101 as an example, and the present disclosure is not limited thereto. The auxiliary electrode 111 of the present disclosure may be embedded only in the internal light extraction layer 140 or the buffer layer 101. In addition, the auxiliary electrode 111 of the present disclosure may be embedded up to a thickness of the internal light extraction layer 140 and/or the buffer layer 101 or may be embedded up to a part of the thickness of the internal light extraction layer 140 and/or the buffer layer 101. Moreover, the present disclosure may add a specific layer of an inorganic layer to embed the auxiliary electrode 111.

At this time, FIG. 6B shows that the auxiliary electrode 111 is embedded in the internal light extraction layer 140 and the buffer layer 101 so as to have a reversed taper as an example, but the present disclosure is not limited thereto.

The auxiliary electrode 111 may be embedded to have a taper of substantially 90 degrees.

Furthermore, the auxiliary electrode 111 according to the first aspect of the present disclosure may not protrude above the embedded layer (i.e., the internal light extraction layer 140 and/or the buffer layer 101) and may be embedded in the same layer or in the lower layer. Accordingly, the buffer layer 101 where the auxiliary electrode 111 is embedded can have a planarized surface. In this case, a step is not formed between the auxiliary electrode 111 and the upper layer, and it is possible to prevent the passivation layer and the cathode from being cracked due to the step and taper of the auxiliary electrode of the related art. As a result, the effect of improving the reliability of the lighting panel can be provided.

In addition, the auxiliary electrode 111 is arranged in a shape of a mesh with a thin width, a hexagon, an octagon or a circle all over the emission portion such that uniform currents can be applied to the first electrode all over the emission portion and a large area lighting panel can emit light of uniform brightness.

The auxiliary electrode 111 embedded according to the first aspect of the present disclosure can be formed by various methods such as a laser patterning process or a photolithography process, and this will be described in detail with reference to the following drawings.

Figure 8C:
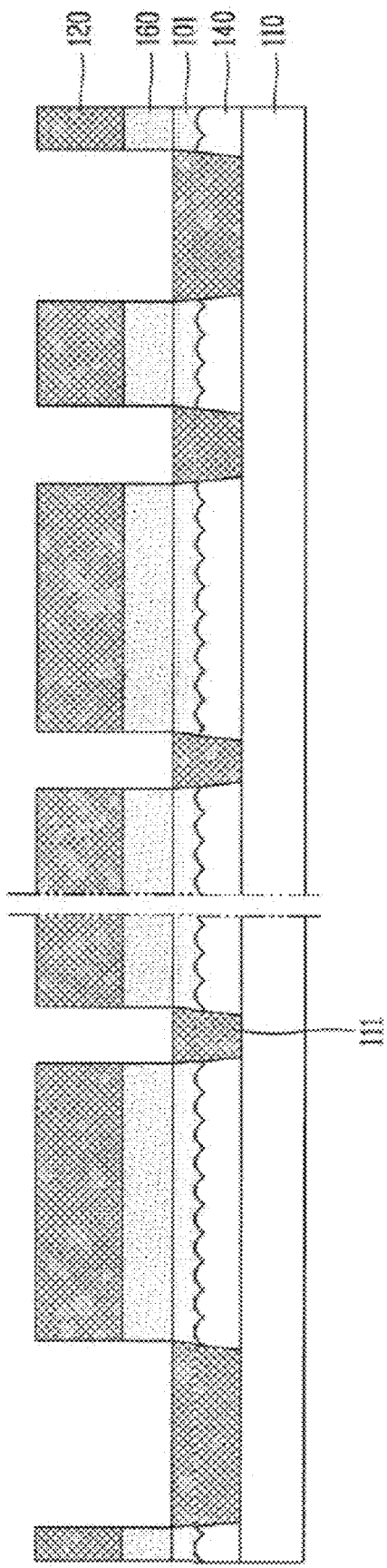

FIGS. 8A to 8C are cross-sectional views specifically illustrating a method of forming the auxiliary electrode shown in FIG. 6B.

At this time, in the method of forming the auxiliary electrode shown in FIGS. 8A to 8C, the internal light extraction layer and the buffer layer are patterned using a laser patterning process, and the auxiliary electrode is formed using a photolithography process, as an example.

Referring to FIG. 8A, a laser 150 is irradiated on the substrate 110 where the internal light extraction layer 140 and the buffer layer 101 are formed, thereby partially removing the internal light extraction layer 140 and the buffer layer 101.

At this time, the internal light extraction layer 140 and the buffer layer 101, which are selectively removed, may include an auxiliary electrode pattern T having a depressed shape, and the auxiliary electrode pattern T may be provided in a region where the auxiliary electrode will be formed later.

Here, FIG. 8A shows a case where the internal light extraction layer 140 and the buffer layer 101 are patterned such that a width of the auxiliary electrode pattern T is narrowed from the top to the bottom as an example, but the present disclosure is not limited thereto.

After this, referring to FIG. 8B, a predetermined photoresist pattern 160 is formed on the buffer layer 101 excluding the auxiliary electrode pattern T so as to form the auxiliary electrode.

Referring to FIG. 8C, a predetermined conductive material is deposited on a substantially entire surface of the substrate 110 including the inside of the auxiliary electrode pattern T to thereby form a conductive layer 120.

At this time, the conductive material deposited inside the auxiliary electrode pattern T constitutes the auxiliary electrode 111.

The conductive material for forming the auxiliary electrode 111 and the conductive layer 120 may include a metal having good conductivity such as Al, Au, Cu, Ti, W, Mo, or an alloy thereof.

Thereafter, the photoresist pattern 160 and the conductive layer 120 on the photoresist pattern 160 are selectively removed through a lift-off process, thereby forming the auxiliary electrode 111 made of the conductive material inside the internal light extraction layer 140 and the buffer layer 101, that is, inside the auxiliary electrode pattern T.

Figure 9A:
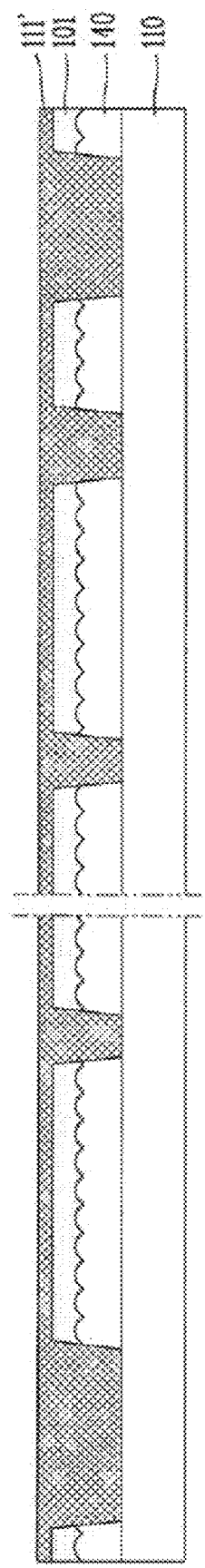

FIGS. 9A and 9B are cross-sectional views specifically illustrating another method of forming the auxiliary electrode shown in FIG. 6B.

At this time, the method of FIGS. 9A and 9B is substantially the same as the method of FIGS. 8A to 8C described above except that a soluble coating process is used to form the auxiliary electrode instead of the photolithography process.

Referring to FIG. 9A, a predetermined area of the internal light extraction layer 140 and the buffer layer 101 is removed using the above-described laser patterning process to thereby form an auxiliary electrode pattern having a depressed shape.

Thereafter, a liquid-type metal is coated on the substantially entire surface of the substrate 110, thereby forming a metal layer 111'. At this time, the metal layer 111' may be formed on the substantially entire surface of the substrate 110 including the inside of the auxiliary electrode pattern.

Then, a tool such as a blade 155 can be inserted into one direction from one side to another side of the substrate 110, thereby removing the metal layer on the substrate 110 excluding the inside of the auxiliary electrode pattern and forming the predetermined auxiliary electrode 111.

Figure 10B:
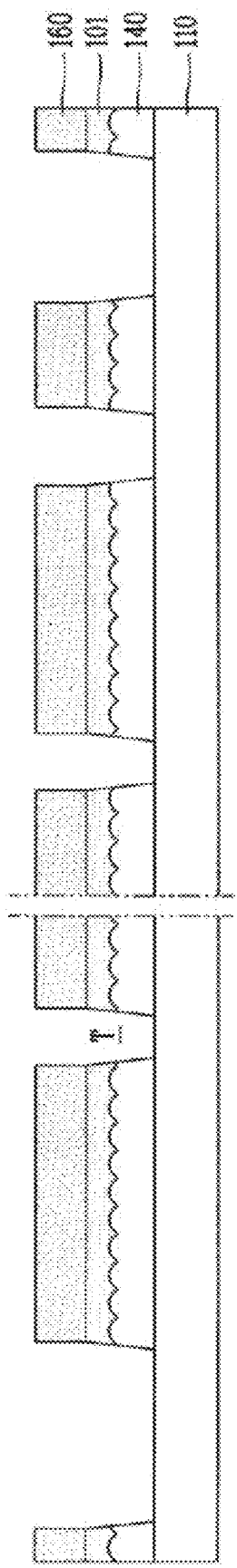
Figure 10C:
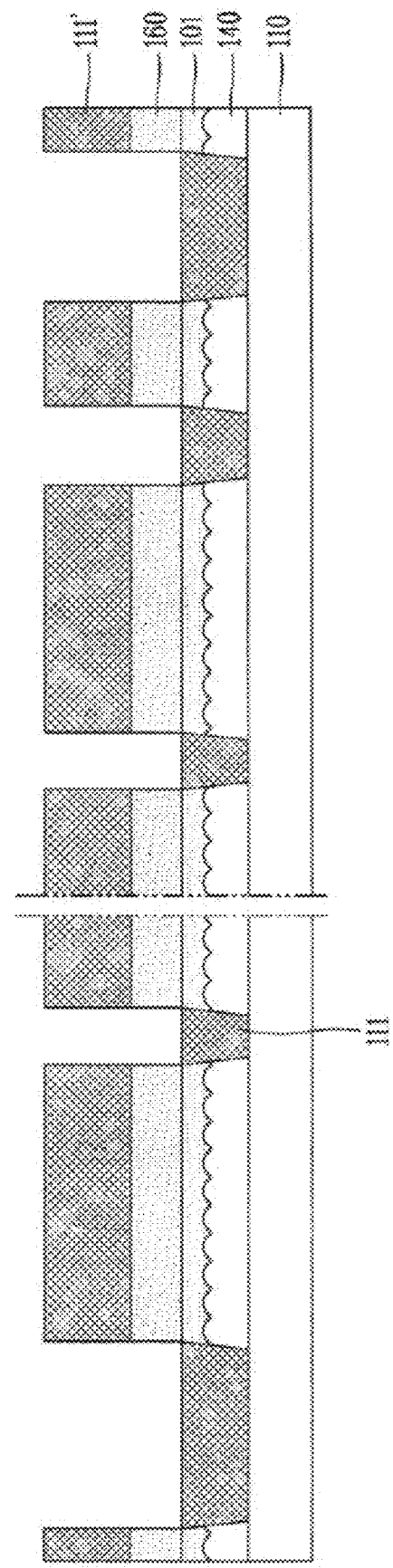

FIGS. 10A to 10C are cross-sectional views specifically illustrating another method of forming the auxiliary electrode shown in FIG. 6B.

At this time, the method of FIGS. 10A to 10C shows a case where the internal light extraction layer and the buffer layer are patterned using a photolithography process instead of the laser patterning process, and at the same time, the auxiliary electrode is formed, as an example.

Referring to FIG. 10A, a predetermined photoresist pattern 160 is formed on the substrate 110 on which the internal light extraction layer 140 and the buffer layer 101 are formed.

At this time, the photoresist pattern 160 may be formed on the buffer layer 101 excluding the region where the auxiliary electrode is formed later.

Next, referring to FIG. 10B, the internal light extraction layer 140 and the buffer layer 101 are selectively removed using the photoresist pattern 160 as a mask, thereby forming an auxiliary electrode pattern T having a depressed shape inside the internal light extraction layer 140 and the buffer layer 101.

At this time, FIG. 10B shows a case where the internal light extraction layer 140 and the buffer layer 101 are patterned such that a width of the auxiliary electrode pattern T is narrowed from the top to the bottom as an example, but the present disclosure is not limited thereto.

Next, referring to FIG. 10C, a predetermined conductive material is deposited on the substantially entire surface of the substrate including the inside of the auxiliary electrode pattern T, thereby forming a conductive layer 111' on the photoresist pattern 160.

At this time, the conductive material deposited inside the auxiliary electrode pattern T constitutes the auxiliary electrode 111.

The conductive material for forming the auxiliary electrode 111 and the conductive layer 111' may include a metal having good conductivity such as Al, Au, Cu, Ti, W, Mo, or an alloy thereof.

Thereafter, the photoresist pattern 160 and the conductive layer 111' on the photoresist pattern 160 are selectively removed through a lift-off process, thereby forming the auxiliary electrode 111 made of the conductive material inside the internal light extraction layer 140 and the buffer layer 101, that is, inside the auxiliary electrode pattern T.

Figure 6C:
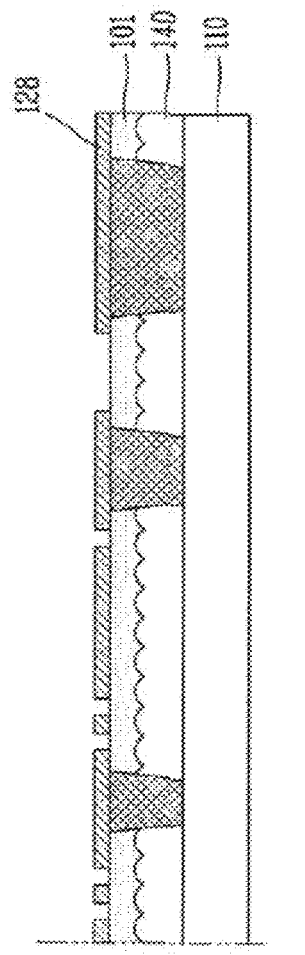

Then, referring to FIG. 5C and FIG. 6C, a transparent conductive material such as ITO or IZO is deposited over the substantially entire surface of the substrate 110 and is etched to thereby form a first electrode 116 including a first contact electrode 127 and a second contact electrode 128 in the emission portion and the first and second contact portions.

At this time, the first electrode 116 may extend into the first contact portion outside the emission portion to constitute the first contact electrode, and the second contact electrode 128, which is electrically insulated from the first electrode 116, may be formed in a part of the emission portion and the second contact portion. That is, the second contact electrode 128 is formed in the same layer as the first electrode 116 and may be separated and electrically isolated from the first electrode 116.

For example, FIG. 5C shows an example where the first electrode 116 including the first contact electrode 127 has a rectangular shape as a whole, an upper center part of the first electrode 116 is removed to form a recession, and the second contact electrode 128 is formed in the recession, but the present disclosure is not limited thereto.

At this time, a predetermined short reduction pattern 117 may be formed in the first electrode 116 at the periphery of the inside of an emission area In the present disclosure, since the auxiliary electrode 111 is embedded and formed in the internal light extraction layer 140 and the buffer layer 101, the first electrode 116 on the auxiliary electrode 111 is formed without a step.

Referring to FIG. 5D and FIG. 6D, an inorganic material such as SiNx or SiOx or an organic material such as photo acryl is layered substantially all over the substrate 110. Then, the inorganic material or the organic material is etched to thereby form a first passivation layer 115a on the auxiliary electrode 111 in the emission portion and simultaneously form a contact hole 114 exposing the second contact electrode 128.

At this time, the first passivation layer 115a is formed on the first electrode 116 so as to cover the auxiliary electrode 111 and is not formed in the emission area where light is actually emitted. However, referring FIG. 5D and FIG. 7, the first passivation layer 115a may be formed to have a mesh shape in the center of the emission portion so as to cover the auxiliary electrode 111 arranged in a mesh shape. In FIG. 5D, the first passivation layer 115a has a rectangular frame shape having a uniform width as a whole, and as described above, the first passivation layer 115a may have a mesh shape in the center of the emission portion so as to cover the auxiliary electrode 111 arranged in a mesh shape. In addition, FIG. 5D shows an example in which the first passivation layer 115a on the first electrode 116 is separated from the first passivation layer 115a on the second contact electrode 128, but the present disclosure is not limited thereto.

Here, the first passivation layer 115a may be formed inside the short reduction pattern 117.

Thereafter, referring to FIGS. 5E and 5F and FIGS. 6E and 6F, an organic light-emitting layer 130 and a second electrode 126 are formed of an organic light-emitting material and a metal, respectively, in the emission portion of the substrate 110.

Figure 5E:
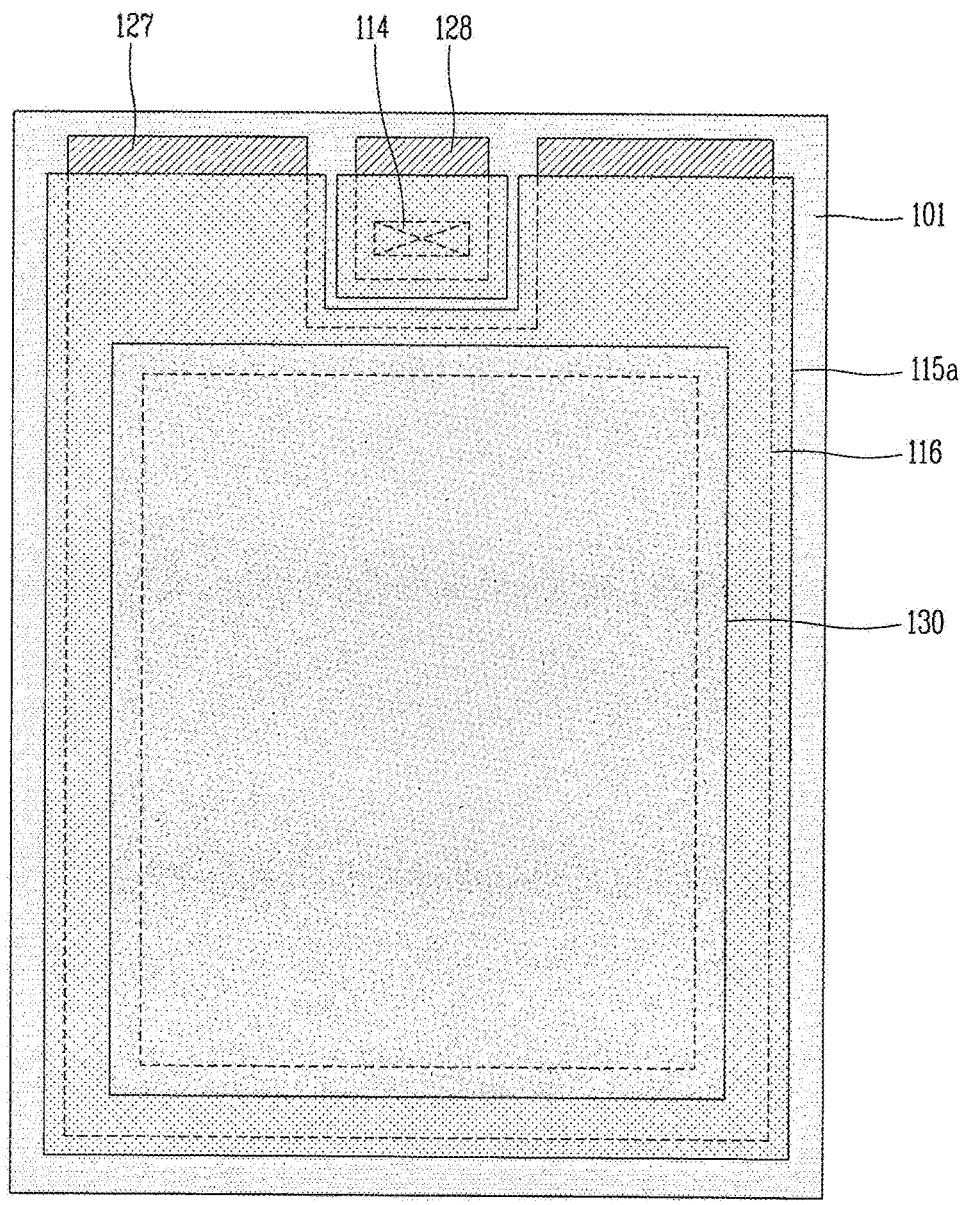

First, referring to FIG. 5E and FIG. 6E, the organic light-emitting layer 130 of an organic light-emitting material is formed in the emission portion of the substrate 110.

At this time, the organic light-emitting layer 130, as a white light-emitting layer, may include a red light-emitting layer, a green light-emitting layer and a blue light-emitting layer or may have a tandem structure including a blue light-emitting layer and a yellow-green light-emitting layer. In addition, the organic light-emitting layer 130 may further include an electron injection layer and a hole injection layer for injecting electrons and holes into the light-emitting layer, respectively, an electron transport layer and a hole transport layer for transporting the injected electrons and holes to the light-emitting layer, respectively, and a charge generation layer for generating charges such as electrons and holes.

Figure 5F:
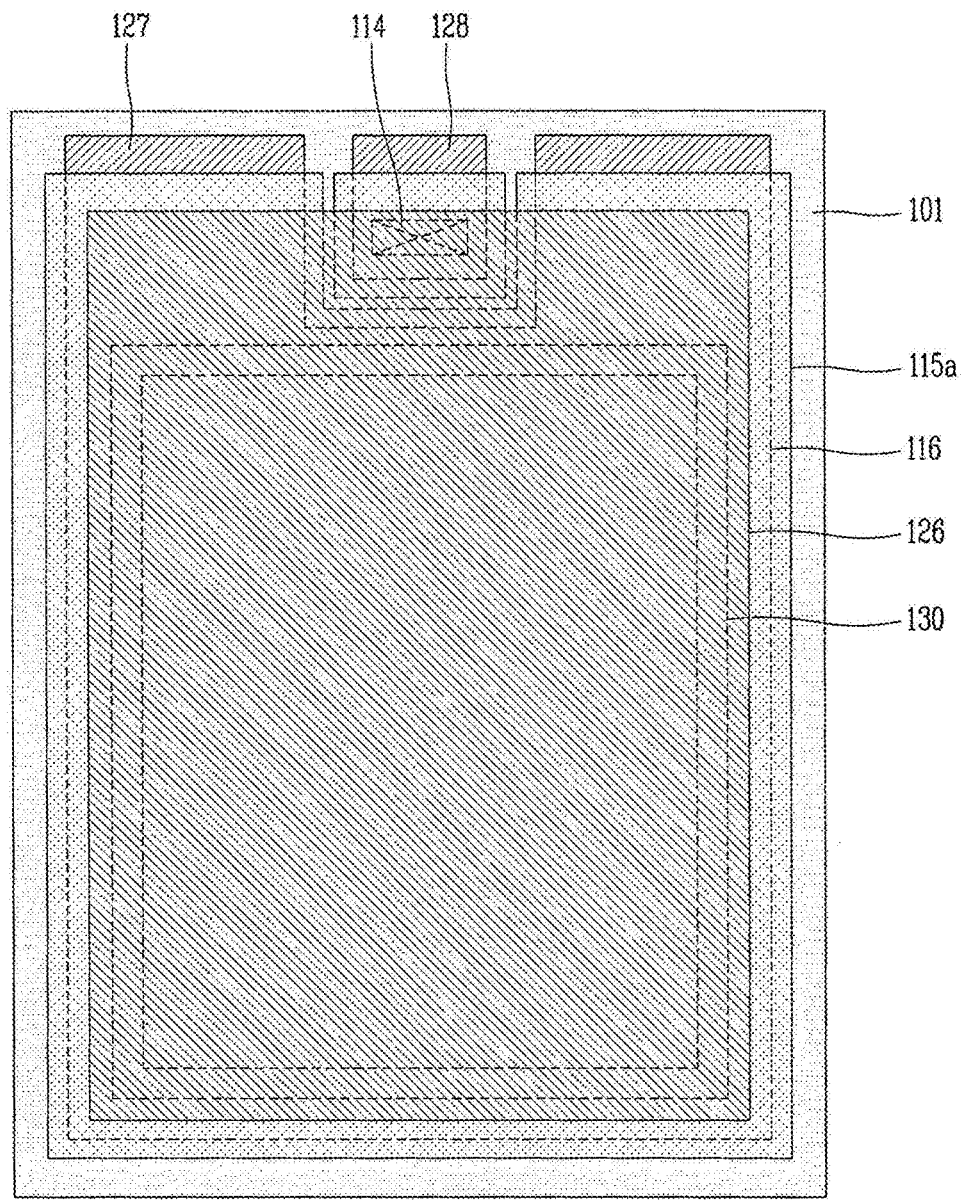
Figure 6F:
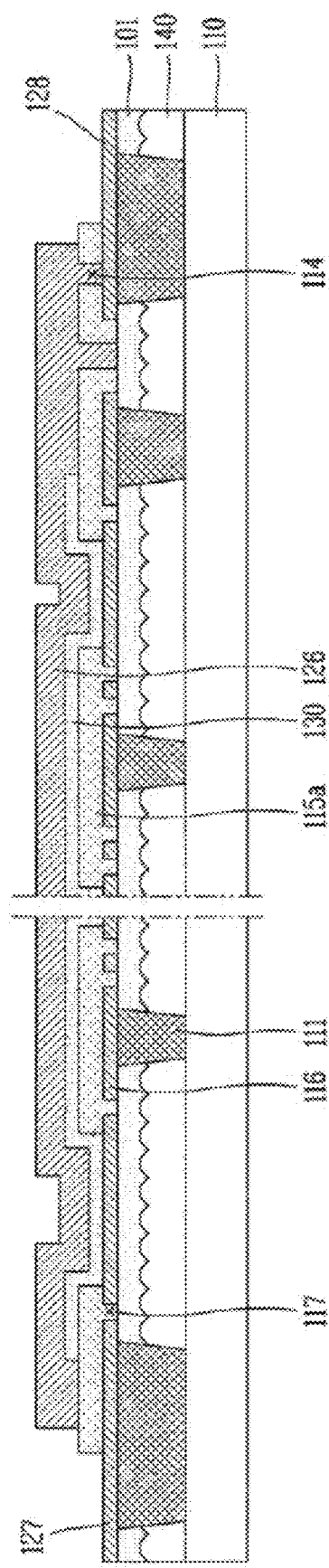

Next, referring to FIG. 5F and FIG. 6F, the second electrode 126 of a metal is formed in the emission portion of the substrate 110 so as to cover the organic light-emitting layer 130.

At this time, the second electrode 126 may be electrically connected to the second contact electrode 128 thereunder through the contact hole 114.

The second electrode 126 may be formed of a metal such as magnesium, calcium, sodium, titanium, indium, yttrium, lithium, gadolinium, aluminum, silver, tin and lead or an alloy thereof.

The first electrode 116, the organic light-emitting layer 130 and the second electrode 126 constitute an organic light-emitting diode.

At this time, since the first passivation layer 115 is disposed on the auxiliary electrode 111 of the emission portion, the organic light-emitting layer 130 on the auxiliary electrode 111 does not directly contact the first electrode 116, and an organic light-emitting diode is not formed on the auxiliary electrode 111.

Although not shown, a second passivation layer of an organic material may be formed in the emission portion of the substrate 110 so as to cover the organic light-emitting layer 130 and the second electrode 126.

At this time, as described above, the second passivation layer may be formed so as to cover the organic light-emitting layer 130 and the second electrode 126 of the emission portion and may prevent moisture from penetrating into the organic light-emitting layer 130 of the emission portion.

The organic light-emitting layer 130, the second electrode 126 and the second passivation layer may be formed in-line through roll-manufacturing apparatus, but the present disclosure is not limited thereto.

Next, a third passivation layer may be formed in the emission portion of the substrate 110 so as to cover the second passivation layer.

The third passivation layer may be formed through another roll-manufacturing apparatus.

The third passivation layer may be formed of an inorganic material such as SiOx or SiNx. However, the present disclosure is not limited thereto.

A predetermined encapsulant may be further provided on the third passivation layer, and the encapsulant may be formed of an epoxy compound, an acrylate compound or an acrylate compound.

Figure 5G:
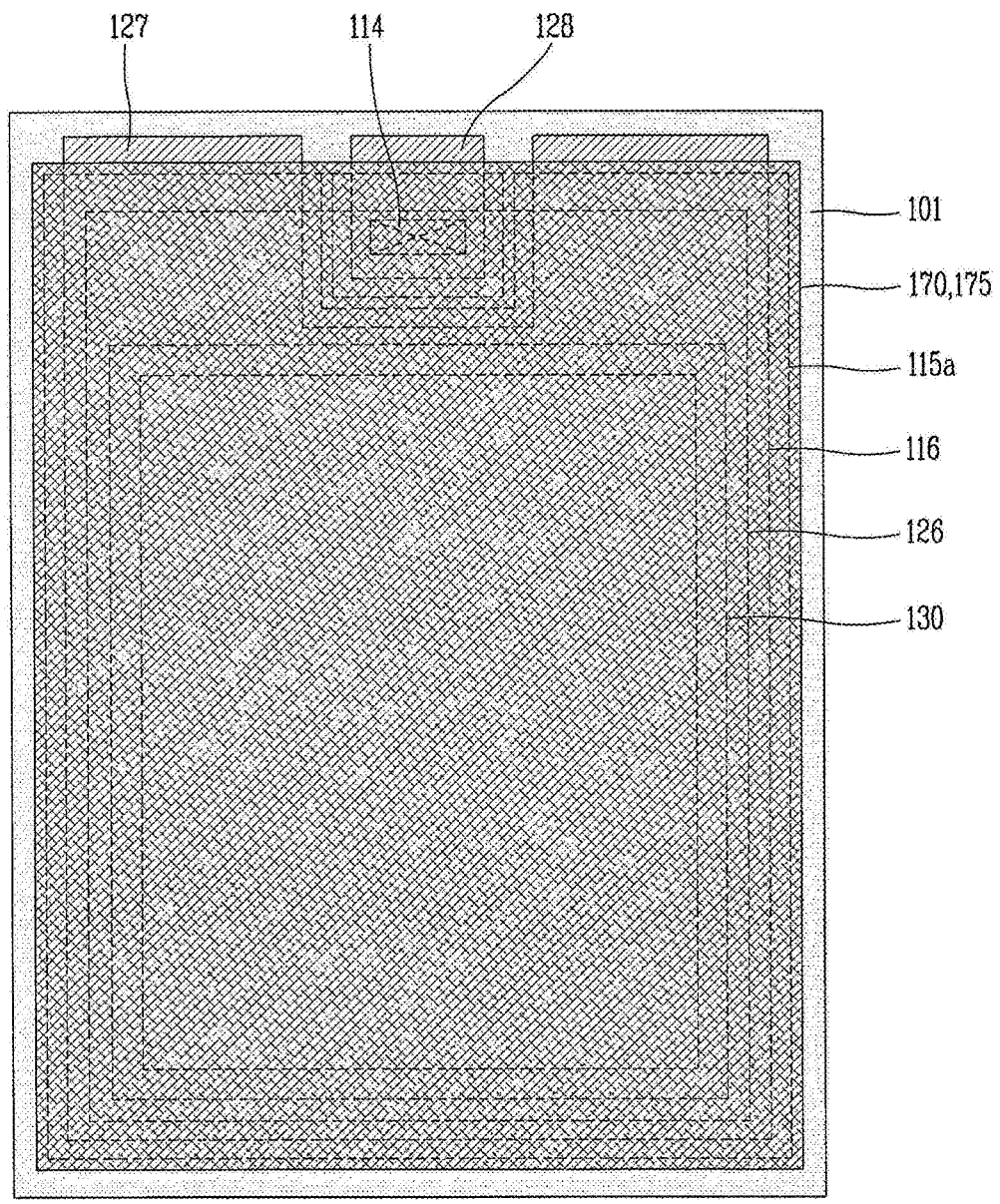
Figure 6G:
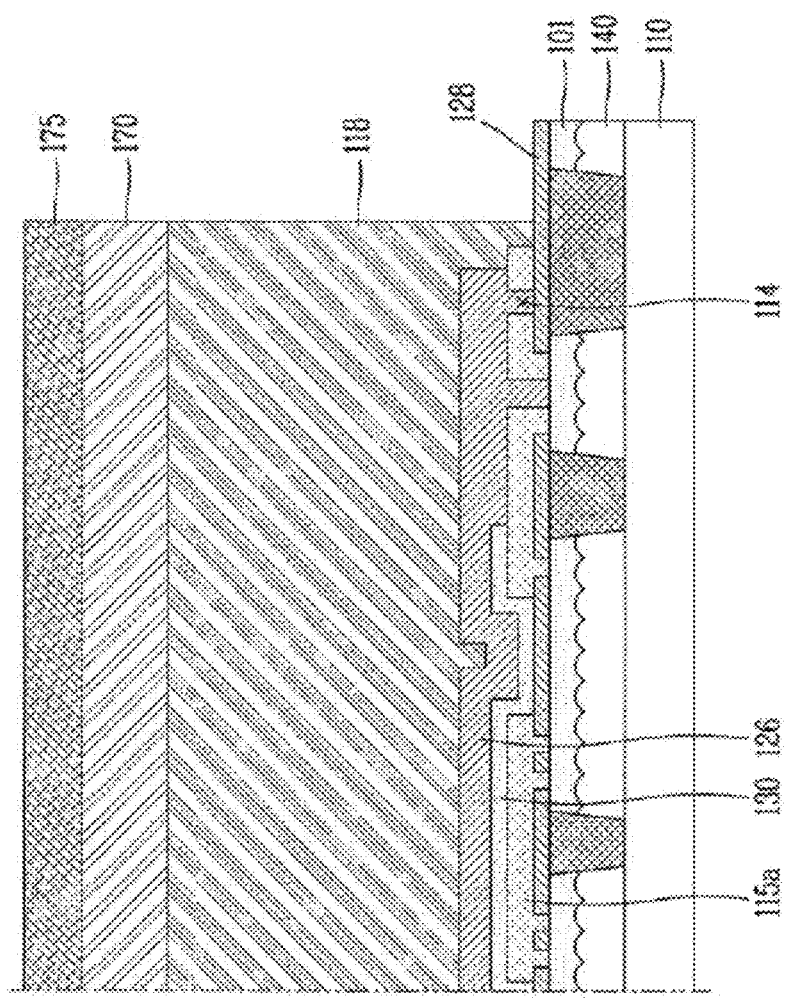

Then, referring to FIG. 5G and FIG. 6G, an adhesive 118 of a photo-curable adhesive material or a thermosetting adhesive material is applied on the emission portion of the substrate 110. In addition, a metal film 170 is disposed thereon, and the metal film 170 is attached thereto by curing the adhesive 118.

At this time, since the first and second contact portions are not covered by the encapsulation member of the metal film 170, the first and second portions may be electrically connected to the outside through the first and second contact electrodes 127 and 128.

Thereafter, a predetermined protection film 175 may be attached to a substantially entire surface of the emission portion of the substrate 110 excluding the contact portions, thereby completing the lighting panel.

Like this, the first aspect of the present disclosure is characterized in that the auxiliary electrode is embedded in the internal light extraction layer and the buffer layer up to the thickness of the internal light extraction layer and the buffer layer. In the present disclosure, it is possible to prevent the first, second and third passivation layers and the second electrode from being cracked due to the step and taper of the auxiliary electrode, thereby improving the reliability of the lighting panel.

However, as described above, the auxiliary electrode of the present disclosure may be embedded only in the internal light extraction layer or the buffer layer. In addition, the auxiliary electrode of the present disclosure may be embedded up to a part of the thickness of the internal light extraction layer and/or the buffer layer. Moreover, in the present disclosure, a specific layer of an inorganic film can be added so as to embed the auxiliary electrode, and this will be described in detail with reference to the following second to fourth aspects.

Figure 11:
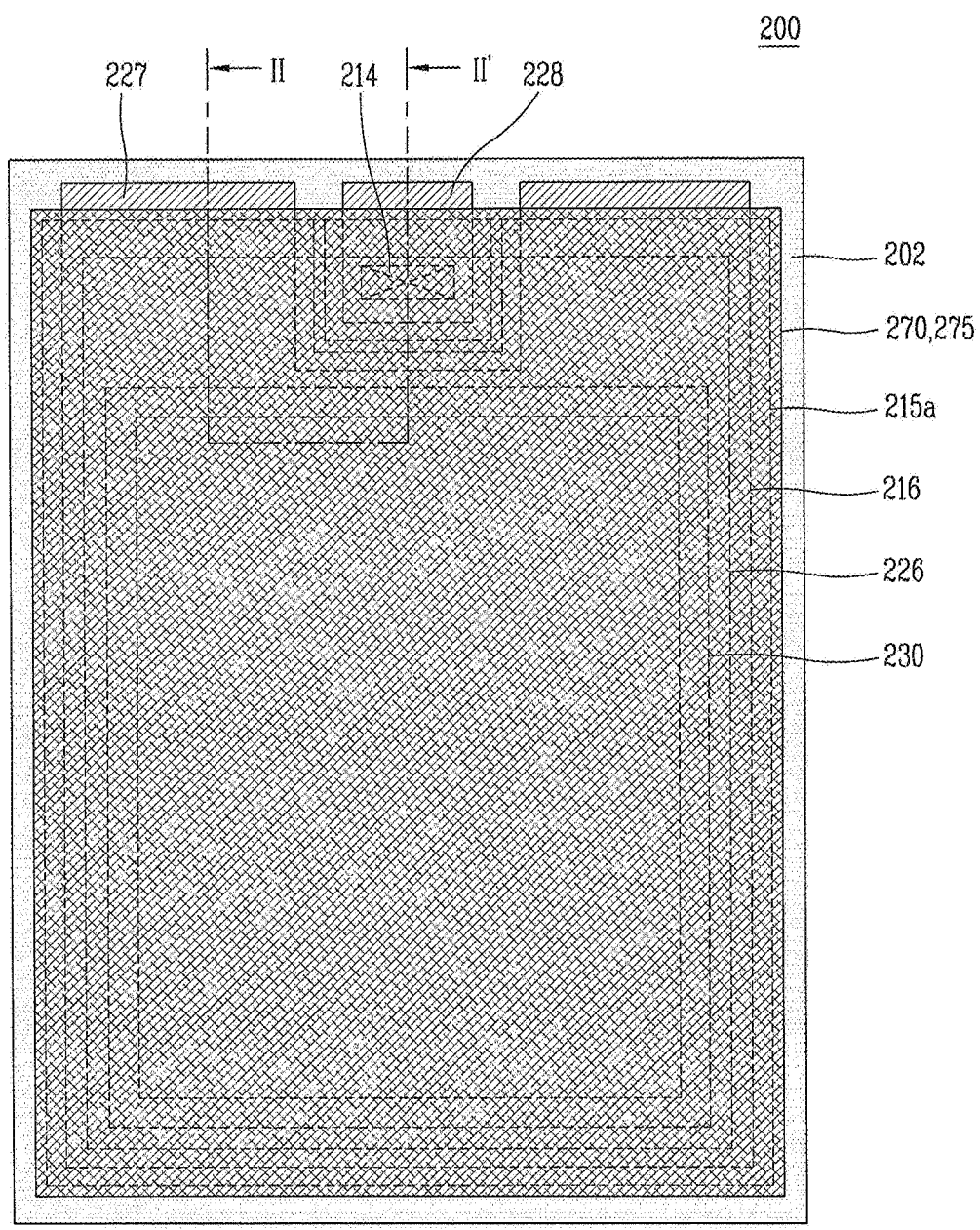
FIG. 11 is a plan view schematically showing a lighting panel using an organic light-emitting diode according to a second aspect of the present disclosure.

FIG. 11 is a plan view schematically showing a lighting panel using an organic light-emitting diode according to a second aspect of the present disclosure.

Figure 12:
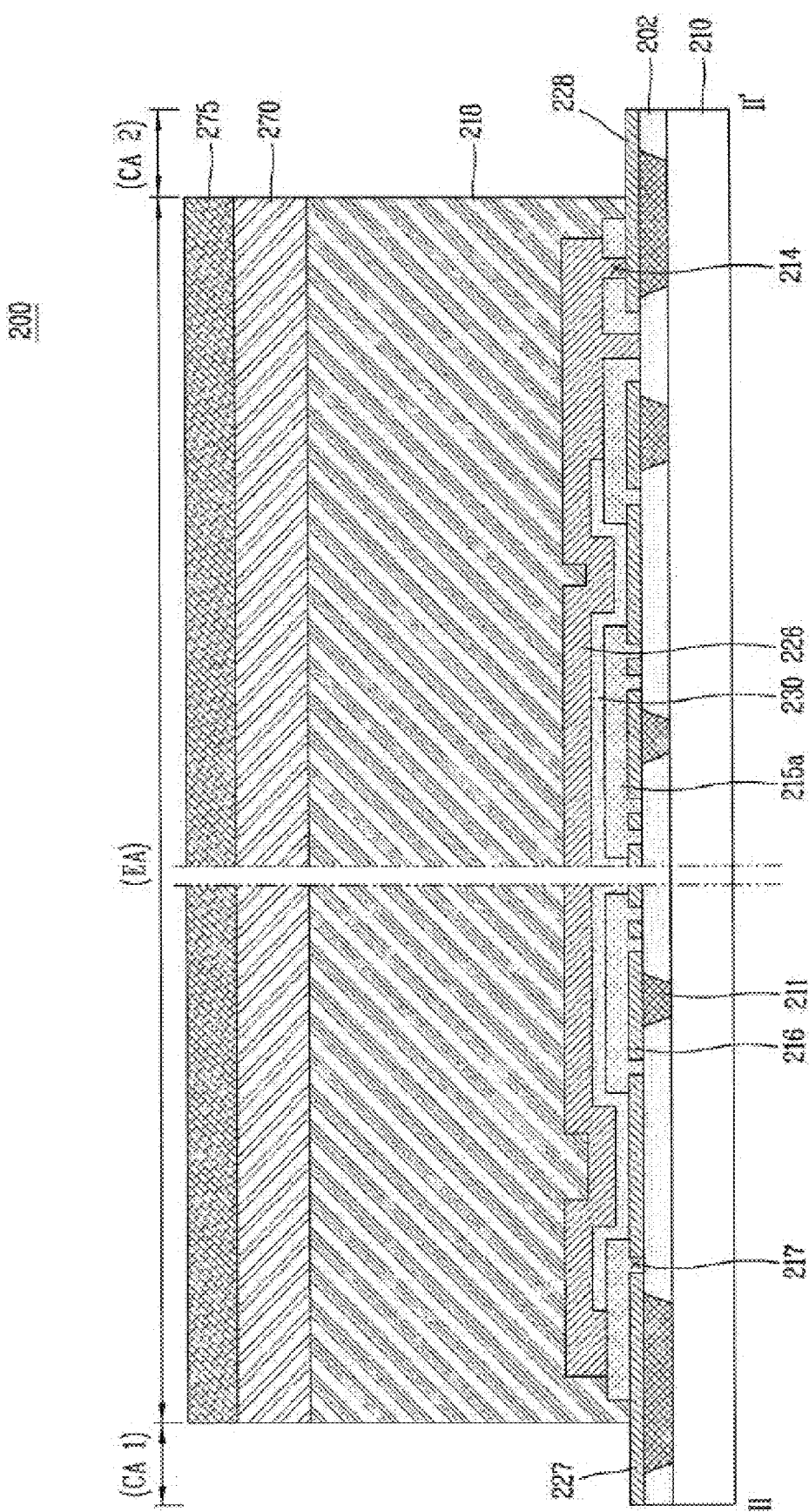
FIG. 12 is a view schematically showing a cross-section of the lighting panel using an organic light-emitting diode according to the second aspect of the present disclosure taken the line II-II' in FIG. 11.

FIG. 12 is a view schematically showing a cross-section of the lighting panel using an organic light-emitting diode according to the second aspect of the present disclosure taken the line II-II' in FIG. 11.

The lighting panel using an organic light-emitting diode according to the second aspect of the present disclosure shown in FIG. 11 and FIG. 12 has substantially the same structure as that of the first aspect of the present disclosure described above except that the internal light extraction layer is removed and the auxiliary electrode is embedded only in the buffer layer.

That is, the lighting panel using an organic light-emitting diode according to the second aspect of the present disclosure may include an organic light-emitting diode unit for emitting planar light and an encapsulation unit for encapsulating the organic light-emitting diode unit.

At this time, an external light extraction layer may be further provided under the organic light-emitting diode unit to increase the haze. However, the present disclosure is not limited thereto, and an external light extraction layer may not be provided.

The external light extraction layer may be formed of scattering particles of $TiO_2$ or the like dispersed in a resin and may be attached to a lower portion of a substrate through an adhesive layer.

The organic light-emitting diode unit includes an organic light-emitting diode provided on the substrate. At this point, in the second aspect of the present disclosure, an internal light extraction layer is not provided between the substrate and the organic light-emitting diode.

Referring to FIG. 11 and FIG. 12, the substrate 210 may include an emission portion EA that actually emits light and outputs the light to the outside and contact portions CA1 and CA2 that are electrically connected to the outside through contact electrodes 227 and 228 to apply a signal to the emission portion EA.

The contact portions CA1 and CA2 may not be covered by an encapsulation member of a metal film 270 and/or a protection film 275 and may be electrically connected to the outside through the contact electrodes 227 and 228. Therefore, the metal film 270 and/or protection film 275 may be attached to an entire surface of the emission portion EA of the substrate 210 excluding the contact portions CA1 and CA2. However, the present disclosure is not limited thereto.

At this time, the contact portions CA1 and CA2 may be located outside the emission portion EA. FIG. 11 shows that a second contact portion CA2 including the contact electrode 228 is disposed between first contact portions CA1 including the contact electrode 227 as an example, but the present disclosure is not limited thereto.

In addition, FIG. 11 illustrates that the contact portions CA1 and CA2 are located only at one side of the emission portion EA, but the present disclosure is not limited thereto. Accordingly, the contact portions CA1 and CA2 of the present disclosure may be disposed both at upper and lower sides of the emission portion EA.

A first electrode 216 and a second electrode 226 may be disposed on the substrate 210, and an organic light-emitting layer 230 may be disposed between the first electrode 216 and the second electrode 226, thereby forming the organic light-emitting diode. In the lighting panel 200 having the above structure, the organic light-emitting layer 230 emits light by applying currents to the first electrode 216 and the second electrode 226 of the organic light-emitting diode, and light is outputted through the emission portion EA.

At this time, a first passivation layer 215a, the organic light-emitting layer 230 and the second electrode 226 are not formed in the contact portions CA1 and CA2 outside the emission portion EA, and the contact electrodes 227 and 228 may be exposed to the outside.

At this time, although not shown in the figures, a second passivation layer of an organic material and a third passivation layer of an inorganic material may be formed in the emission portion EA so as to cover the organic light-emitting layer 230 and the second electrode 226.

As described above, the first electrode 216 including the first contact electrode 227 and the second contact electrode 228 are disposed on the substrate 210 of a transparent material. The substrate 210 may be formed of a rigid material such as glass. However, by using a material having flexibility such as plastic, it is possible to manufacture the lighting panel 200 which can be bent. Moreover, in the present disclosure, by using a plastic material having flexibility as the substrate 210, it is possible to perform a process using a roll, thereby manufacturing the lighting panel 200 quickly.

The first electrode 216 including the first contact electrode 227 and the second contact electrode 228 may be disposed in the emission portion EA and the first and second contact portions CA1 and CA2 and may be formed of a transparent conductive material having relatively high conductivity and high work function.

At this time, in the present disclosure, a short reduction pattern 217 is formed in the first electrode 216 for providing each pixel with currents to reflect a narrow path, and the first passivation layer 215a covers the short reduction pattern 217 to prevent occurrence of a short circuit. That is, the short reduction pattern 217 is formed so as to surround the periphery of an emission area of each pixel, and a resistance is added to each pixel, thereby limiting the currents flowing to a short-circuit occurrence region.

The first electrode 216 may extend to the first contact portion CA1 outside the emission portion EA and may constitute the first contact electrode 227. The second contact electrode 228 may be disposed in the second contact portion CA2 and may be electrically insulated from the first electrode 216. Namely, the second contact electrode 228 may be disposed in the same layer as the first electrode 216 and may be separated and electrically isolated from the first electrode 216.

As an example, FIG. 11 shows that the first electrode 216 including the first contact electrode 227 has a rectangular shape as a whole and includes an upper center portion, which is removed to form a recession, and the second contact electrode 228 is disposed in the recession. However, the present disclosure is not limited thereto.

An auxiliary electrode 211 may be disposed in the emission portion EA and the first contact portion CA1 on the substrate 210 and may be electrically connected to the first electrode 216 and the first contact electrode 227.

Like the first aspect of the present disclosure, the auxiliary electrode 211 is arranged in a shape of a mesh with a thin width, a hexagon, an octagon or a circle all over the emission portion EA such that uniform currents can be applied to the first electrode 216 all over the emission portion EA and the large area lighting panel 200 can emit light of uniform brightness.

FIG. 12 shows that the auxiliary electrode 211 is disposed under the first electrode 216 including the first contact electrode 227 and is embedded in the buffer layer 202 as an example, but as stated above, the present disclosure is not limited thereto. The auxiliary electrode 211 of the present disclosure may be embedded up to a thickness of the buffer layer 202 or may be embedded up to a part of the thickness of the buffer layer 202.

At this time, the buffer layer 202 according to the second aspect of the present disclosure may be formed of an inorganic film to embed the auxiliary electrode 211.

At this time, in FIG. 12, as an example, the auxiliary electrode 211 is embedded with a reversed taper in the buffer layer 202, but the present disclosure is not limited thereto. The auxiliary electrode 211 may be embedded with a taper of substantially 90 degrees. As described above, the reversed taper means that an upper part of the auxiliary electrode 211 embedded in the buffer layer 202 has a wider width than a lower part thereof. Accordingly, when the auxiliary electrode 211 has a taper of 90 degrees, the width of the upper part is substantially equal to the width of the lower part.

The auxiliary electrode 211 according to second aspect of the present disclosure may be embedded in the same layer or the lower layer without protruding above the buffer layer 202.

Like this, when the auxiliary electrode 211 is embedded in the buffer layer 202, a step is not formed between the auxiliary electrode 211 and the upper layer, and it is prevented that the passivation layers (i.e., the first, second and third passivation layers 215a) and a cathode (i.e., the second electrode 226) are cracked due to the step and taper of the related art auxiliary electrode. As a result, the effect of improving the reliability of the lighting panel can be provided.

At this time, the auxiliary electrode 211 disposed in the first contact portion CA1 is used as a transmission path for the currents to the first electrode 216 through the first contact electrode 227. The auxiliary electrode 211 may contact the outside and may serve as a contact electrode for applying currents from the outside to the first electrode 216.

The auxiliary electrode 211 may be formed of a conductive metal such as Al, Au, Cu, Ti, W, Mo or an alloy thereof. The auxiliary electrode 211 may have a two-layer structure of an upper auxiliary electrode and a lower auxiliary electrode, but the present disclosure is not limited thereto. The auxiliary electrode 211 may be formed of a single layer.

The first passivation layer 215a may be formed in the emission portion EA of the substrate 210. In FIG. 11, the first passivation layer 215a is shown as rectangular frame shape having a uniform width as a whole. In practice, the first passivation layer 215a may be removed in a light-emitting region and may be formed in a shape of a mesh so as to cover the auxiliary electrode 211, which is arranged in a shape of a mesh. However, the present disclosure is not limited thereto.

The first passivation layer 215a disposed in the emission portion EA may be formed to cover the auxiliary electrode 211 and the first electrode 216 thereon. The first passivation layer 215a is not formed in the light-emitting region where light is actually emitted.

The first passivation layer 215a may be formed of an inorganic material such as SiOx or SiNx. However, the first passivation layer 215a may be formed of an organic material such as photo acryl or may be composed of a plurality of layers of an inorganic material and an organic material.

In addition, the organic light-emitting layer 230 and the second electrode 226 may be disposed on the substrate 210 on which the first electrode 216 and the first passivation layer 215a are disposed. At this time, the first passivation layer 215a on the second contact electrode 228 in the emission portion EA may be partially removed and may have a contact hole 214 exposing the second contact electrode 228. Accordingly, the second electrode 226 may be electrically connected to the second contact electrode 228 thereunder through the contact hole 214.

The second electrode 226 may be formed of a material having relatively low work function such that electrons are easily injected to the organic light-emitting layer 230. Specific examples of a material used as the second electrode 226 may include a metal such as magnesium, calcium, sodium, titanium, indium, yttrium, lithium, gadolinium, aluminum, silver, tin and lead or an alloy thereof.

The first electrode 216, the organic light-emitting layer 230 and the second electrode 226 of the emission portion EA constitute the organic light-emitting diode.

At this time, although not shown in the figures, the second passivation layer and the third passivation layer may be provided on the substrate 210 on which the second electrode 226 is formed.

The second passivation layer according to the second aspect of the present disclosure, as described above, may be formed to cover the organic light-emitting layer 230 and the second electrode 226 of the emission portion EA and may prevent moisture from penetrating into the organic light-emitting layer 230 of the emission portion EA.

That is, in the present disclosure, the second passivation layer and the third passivation layer are formed to cover the organic light-emitting layer 230 and the second electrode 226 of the emission portion EA in addition to an adhesive 218 and the encapsulation member of the metal film 270, and it is possible to prevent moisture from penetrating into the organic light-emitting layer 230 of the emission portion EA of the lighting panel 200 where light is actually emitted and outputted.

The second passivation layer may be formed of an organic material such as photo acryl. In addition, the third passivation layer may be formed of an inorganic material such as SiOx or SiNx. However, the present disclosure is not limited thereto.

A predetermined encapsulant may be provided on the third passivation layer, and an epoxy compound, an acrylate compound, an acrylic compound, or the like may be used as the encapsulant.

As described above, the first contact electrode 227 extending from the first electrode 216 is exposed to the outside on the substrate 210 of the first contact portion CAl The second contact electrode 228 electrically connected to the second electrode 226 through the contact hole 214 is exposed to the outside on the substrate 210 of the second contact portion CA2. Accordingly, the first contact electrode 227 and the second contact electrode 228 are electrically connected to an external power source, so that currents can be applied to the first electrode 216 and the second electrode 226, respectively.

An adhesive 218 such as PSA (pressure sensitive adhesive) is applied on the third passivation layer, the metal film 270 is disposed thereon, and the metal film 270 is attached to the third passivation layer, so that the lighting panel 200 can be encapsulated.

At this time, the adhesive 218 and the encapsulation member of the metal film 270 can be attached so as to sufficiently cover the second passivation layer and the third passivation layer.

In addition, a predetermined protection film 275 may be disposed thereon and attached to an entire surface of the emission portion EA of the substrate 210 excluding the contact portions CA1 and CA2.

The adhesive 218 may be a photo-curable adhesive or a thermosetting adhesive.

Figure 13:
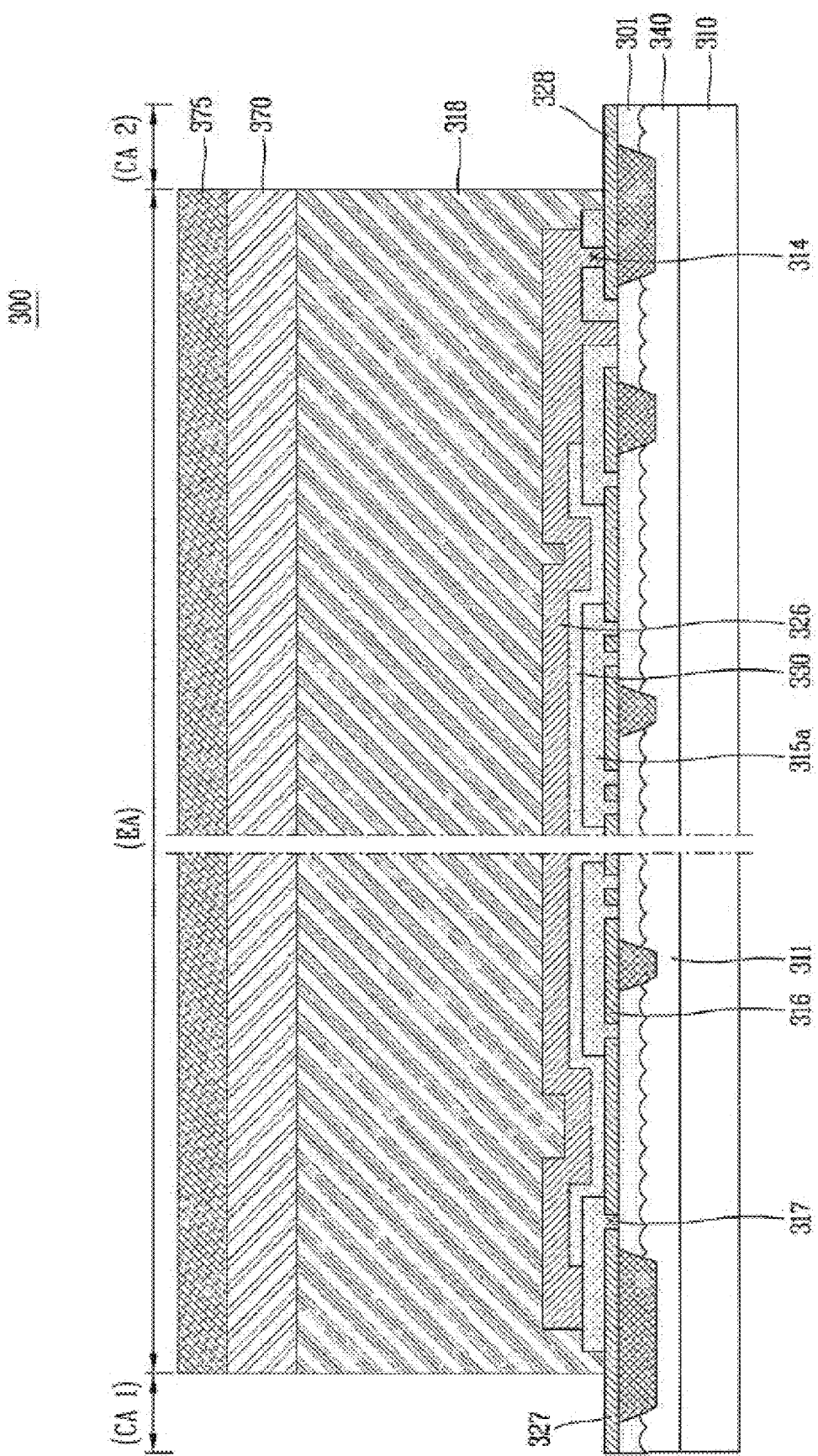
FIG. 13 is a cross-sectional view schematically showing a lighting panel using an organic light-emitting diode according to a third aspect of the present disclosure.

FIG. 13 is a cross-sectional view schematically showing a lighting panel using an organic light-emitting diode according to a third aspect of the present disclosure.

At this time, the lighting panel using an organic light-emitting diode according to the third aspect of the present disclosure shown in FIG. 13 has substantially the same structure as those of the first and second aspects of the present disclosure described above except that the auxiliary electrode is embedded up to a part of a thickness of the internal light extraction layer and/or the buffer layer.

That is, the lighting panel using an organic light-emitting diode according to the third aspect of the present disclosure may include an organic light-emitting diode unit for emitting planar light and an encapsulation unit for encapsulating the organic light-emitting diode unit.

At this time, an external light extraction layer may be further provided under the organic light-emitting diode unit to increase the haze. However, the present disclosure is not limited thereto, and an external light extraction layer may not be provided.

The external light extraction layer may be formed of scattering particles of $TiO_2$ or the like dispersed in a resin and may be attached to a lower portion of a substrate through an adhesive layer.

The organic light-emitting diode unit includes an organic light-emitting diode provided on the substrate. At this point, referring to FIG. 13, an internal light extraction layer 340 may be further provided between a substrate 310 and the organic light-emitting diode. However, the present disclosure is not limited thereto, and an internal light extraction layer may not be provided.

The internal light extraction layer 340 may be formed of scattering particles of $TiO_2$, $ZrO_2$ or the like dispersed in a resin, but the present disclosure is not limited thereto.

A buffer layer 301 may be further provided on the internal light extraction layer 340.

At this time, the substrate 310 may include an emission portion EA that actually emits light and outputs the light to the outside and contact portions CA1 and CA2 that are electrically connected to the outside through contact electrodes 327 and 328 to apply a signal to the emission portion EA.

The contact portions CA1 and CA2 may not be covered by an encapsulation member of a metal film 370 and/or a protection film 375 and may be electrically connected to the outside through the contact electrodes 327 and 328. Therefore, the metal film 370 and/or protection film 375 may be attached to an entire surface of the emission portion EA of the substrate 310 excluding the contact portions CA1 and CA2. However, the present disclosure is not limited thereto.

A first electrode 316 and a second electrode 326 may be disposed on the substrate 310, and an organic light-emitting layer 330 may be disposed between the first electrode 316 and the second electrode 326, thereby forming the organic light-emitting diode. In the lighting panel 300 having the above structure, the organic light-emitting layer 330 emits light by applying currents to the first electrode 316 and the second electrode 326 of the organic light-emitting diode, and light is outputted through the emission portion EA.

At this time, a first passivation layer 315a, the organic light-emitting layer 330 and the second electrode 326 are not formed in the contact portions CA1 and CA2 outside the emission portion EA, and the contact electrodes 327 and 328 may be exposed to the outside.

At this time, although not shown in the figures, a second passivation layer of an organic material and a third passivation layer of an inorganic material may be formed in the emission portion EA so as to cover the organic light-emitting layer 330 and the second electrode 326.

As described above, the first electrode 316 including the first contact electrode 327 and the second contact electrode 328 are disposed on the substrate 310 of a transparent material. The substrate 310 may be formed of a rigid material such as glass. However, by using a material having flexibility such as plastic, it is possible to manufacture the lighting panel 300 which can be bent. Moreover, in the present disclosure, by using a plastic material having flexibility as the substrate 310, it is possible to perform a process using a roll, thereby manufacturing the lighting panel 300 quickly.

The first electrode 316 including the first contact electrode 327 and the second contact electrode 328 may be disposed in the emission portion EA and the first and second contact portions CA1 and CA2 and may be formed of a transparent conductive material having relatively high conductivity and high work function.

At this time, in the present disclosure, a short reduction pattern 317 is formed in the first electrode 316 for providing each pixel with currents to reflect a narrow path, and the first passivation layer 315a covers the short reduction pattern 317 to prevent occurrence of a short circuit. That is, the short reduction pattern 317 is formed so as to surround the periphery of an emission area of each pixel, and a resistance is added to each pixel, thereby limiting the currents flowing to a short-circuit occurrence region.

The first electrode 316 may extend to the first contact portion CA1 outside the emission portion EA and may constitute the first contact electrode 327. The second contact electrode 328 may be disposed in the second contact portion CA2 and may be electrically insulated from the first electrode 316. Namely, the second contact electrode 328 may be disposed in the same layer as the first electrode 316 and may be separated and electrically isolated from the first electrode 316.

An auxiliary electrode 311 may be disposed in the emission portion EA and the first contact portion CA1 on the substrate 310 and may be electrically connected to the first electrode 316 and the first contact electrode 327.

Like the first and second aspects of the present disclosure described above, the auxiliary electrode 311 is arranged in a shape of a mesh with a thin width, a hexagon, an octagon or a circle all over the emission portion EA such that uniform currents can be applied to the first electrode 316 all over the emission portion EA and the large area lighting panel 300 can emit light of uniform brightness.

FIG. 13 shows that the auxiliary electrode 311 is disposed under the first electrode 316 including the first contact electrode 327 and is embedded in the internal light extraction layer 340 and the buffer layer 301 up to a part of a thickness of the internal light extraction layer 340 as an example, but as stated above, the present disclosure is not limited thereto. The auxiliary electrode 311 of the present disclosure may be embedded up to a part of a thickness of the buffer layer 301.

Like this, when the auxiliary electrode 311 is embedded up to the part of the thickness of the internal light extraction layer 340 or the buffer layer 301, there are effects that the tact time for the laser patterning process is reduced and it is possible to prevent yellowing of a glass substrate 310 or damages to a polyimide substrate 310 caused when a surface of the glass or polyimide substrate 310 is exposed.

At this time, in FIG. 13, as an example, the auxiliary electrode 311 is embedded with a reversed taper in the internal light extraction layer 340 and the buffer layer 301, but the present disclosure is not limited thereto. The auxiliary electrode 311 may be embedded with a taper of substantially 90 degrees.

The auxiliary electrode 311 according to third aspect of the present disclosure may be embedded in the internal light extraction layer 340 and the buffer layer 301 without protruding above the buffer layer 301.

Like this, when the auxiliary electrode 311 is embedded in the internal light extraction layer 340 and the buffer layer 301, a step is not formed between the auxiliary electrode 311 and the upper layer, and it is prevented that the first passivation layer 315a to the third passivation layer and the second electrode 326 are cracked due to the step and taper of the related art auxiliary electrode. As a result, the effect of improving the reliability of the lighting panel can be provided.

At this time, the auxiliary electrode 311 disposed in the first contact portion CA1 is used as a transmission path for the currents to the first electrode 316 through the first contact electrode 327. The auxiliary electrode 311 may contact the outside and may serve as a contact electrode for applying currents from the outside to the first electrode 316.

The auxiliary electrode 311 may be formed of a conductive metal such as Al, Au, Cu, Ti, W, Mo or an alloy thereof. The auxiliary electrode 311 may have a two-layer structure of an upper auxiliary electrode and a lower auxiliary electrode, but the present disclosure is not limited thereto. The auxiliary electrode 311 may be formed of a single layer.

The first passivation layer 315a may be formed in the emission portion EA of the substrate 310. Like the first and second aspects of the present disclosure described above, the first passivation layer 315a may be removed in a light-emitting region and may be formed in a shape of a mesh so as to cover the auxiliary electrode 311, which is arranged in a shape of a mesh. However, the present disclosure is not limited thereto.

The first passivation layer 315a disposed in the emission portion EA may be formed to cover the auxiliary electrode 311 and the first electrode 316 thereon. The first passivation layer 315a is not formed in the light-emitting region where light is actually emitted.

The first passivation layer 315a may be formed of an inorganic material such as SiOx or SiNx. However, the first passivation layer 315a may be formed of an organic material such as photo acryl or may be composed of a plurality of layers of an inorganic material and an organic material.

In addition, the organic light-emitting layer 330 and the second electrode 326 may be disposed on the substrate 310 on which the first electrode 316 and the first passivation layer 315a are disposed. At this time, the first passivation layer 315a on the second contact electrode 328 in the emission portion EA may be partially removed and may have a contact hole 314 exposing the second contact electrode 328. Accordingly, the second electrode 326 may be electrically connected to the second contact electrode 328 thereunder through the contact hole 314.

The second electrode 326 may be formed of a material having relatively low work function such that electrons are easily injected to the organic light-emitting layer 330. Specific examples of a material used as the second electrode 326 may include a metal such as magnesium, calcium, sodium, titanium, indium, yttrium, lithium, gadolinium, aluminum, silver, tin and lead or an alloy thereof.

At this time, although not shown in the figures, the second passivation layer and the third passivation layer may be provided on the substrate 310 on which the second electrode 326 is formed.

The second passivation layer according to the third aspect of the present disclosure, as described above, may be formed to cover the organic light-emitting layer 330 and the second electrode 326 of the emission portion EA and may prevent moisture from penetrating into the organic light-emitting layer 330 of the emission portion EA.

The second passivation layer may be formed of an organic material such as photo acryl. In addition, the third passivation layer may be formed of an inorganic material such as SiOx or SiNx. However, the present disclosure is not limited thereto.

A predetermined encapsulant may be provided on the third passivation layer, and an epoxy compound, an acrylate compound, an acrylic compound, or the like may be used as the encapsulant.

An adhesive 318 such as PSA (pressure sensitive adhesive) is applied on the third passivation layer, the metal film 370 is disposed thereon, and the metal film 370 is attached to the third passivation layer, so that the lighting panel 300 can be encapsulated.

At this time, the adhesive 318 and the encapsulation member of the metal film 370 can be attached so as to sufficiently cover the second passivation layer and the third passivation layer.

In addition, a predetermined protection film 375 may be disposed thereon and attached to an entire surface of the emission portion EA of the substrate 310 excluding the contact portions CA1 and CA2.

The adhesive 318 may be a photo-curable adhesive or a thermosetting adhesive.

Figure 14:
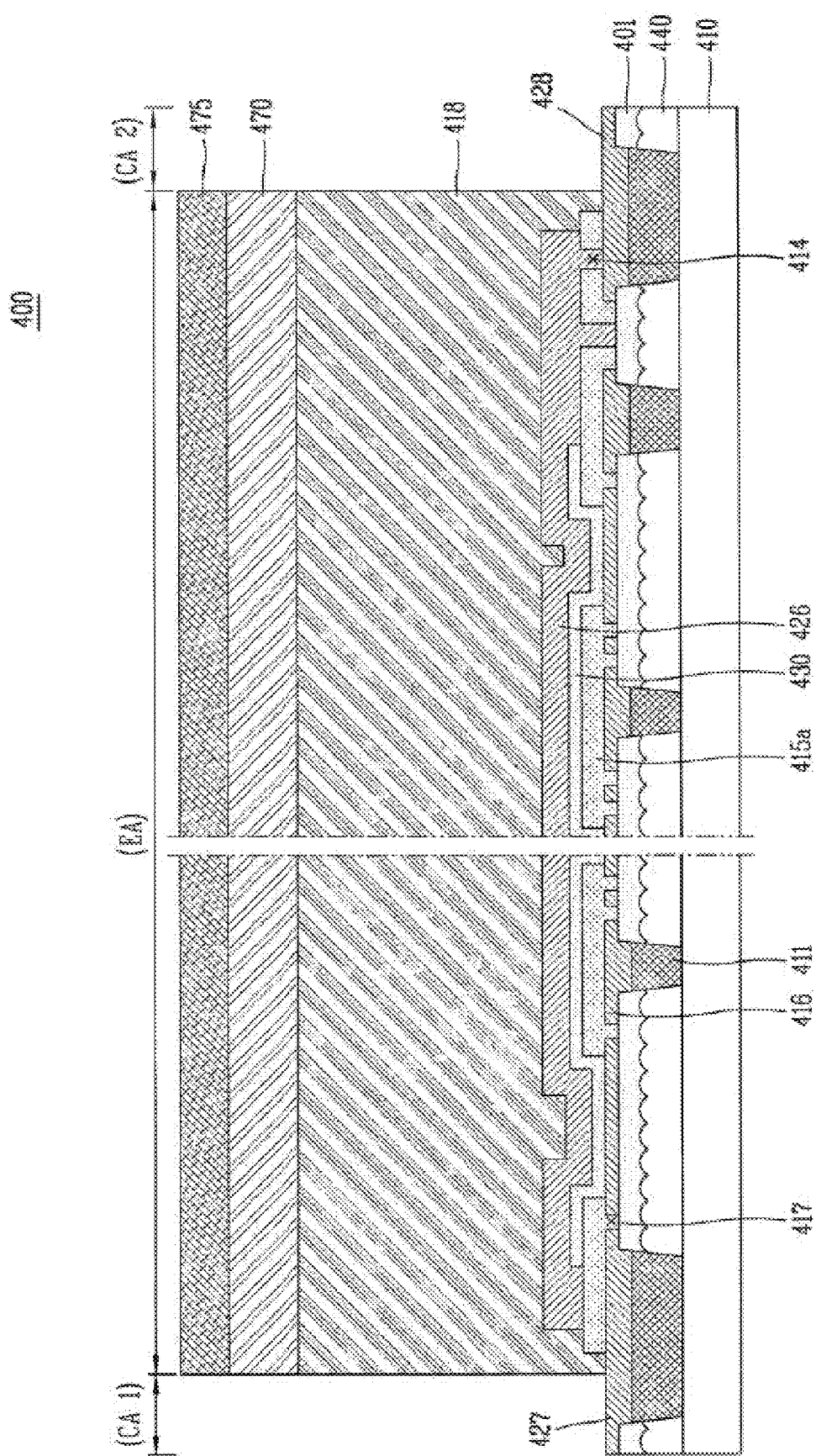
FIG. 14 is a cross-sectional view schematically showing a lighting panel using an organic light-emitting diode according to a fourth aspect of the present disclosure.

FIG. 14 is a cross-sectional view schematically showing a lighting panel using an organic light-emitting diode according to a fourth aspect of the present disclosure.

At this time, the lighting panel using an organic light-emitting diode according to the fourth aspect of the present disclosure shown in FIG. 14 has substantially the same structure as those of the first, second and third aspects of the present disclosure described above except that the auxiliary electrode is embedded up to a part of a thickness of the buffer layer and a portion corresponding to the rest of the thickness of the buffer layer is filled with the first electrode.

That is, the lighting panel using an organic light-emitting diode according to the fourth aspect of the present disclosure may include an organic light-emitting diode unit for emitting planar light and an encapsulation unit for encapsulating the organic light-emitting diode unit.

At this time, an external light extraction layer may be further provided under the organic light-emitting diode unit to increase the haze. However, the present disclosure is not limited thereto, and an external light extraction layer may not be provided.

The external light extraction layer may be formed of scattering particles of $TiO_2$ or the like dispersed in a resin and may be attached to a lower portion of a substrate through an adhesive layer.

The organic light-emitting diode unit includes an organic light-emitting diode provided on the substrate. At this point, referring to FIG. 14, an internal light extraction layer 440 may be further provided between a substrate 410 and the organic light-emitting diode. However, the present disclosure is not limited thereto, and an internal light extraction layer may not be provided.

The internal light extraction layer 440 may be formed of scattering particles of $TiO_2$, $ZrO_2$ or the like dispersed in a resin, but the present disclosure is not limited thereto.

A buffer layer 401 may be further provided on the internal light extraction layer 440.

At this time, the substrate 410 may include an emission portion EA that actually emits light and outputs the light to the outside and contact portions CA1 and CA2 that are electrically connected to the outside through contact electrodes 427 and 428 to apply a signal to the emission portion EA.

The contact portions CA1 and CA2 may not be covered by an encapsulation member of a metal film 470 and/or a protection film 475 and may be electrically connected to the outside through the contact electrodes 427 and 428. Therefore, the metal film 470 and/or protection film 475 may be attached to an entire surface of the emission portion EA of the substrate 410 excluding the contact portions CA1 and CA2. However, the present disclosure is not limited thereto.

A first electrode 416 and a second electrode 426 may be disposed on the substrate 410, and an organic light-emitting layer 430 may be disposed between the first electrode 416 and the second electrode 426, thereby forming the organic light-emitting diode. In the lighting panel 400 having the above structure, the organic light-emitting layer 430 emits light by applying currents to the first electrode 416 and the second electrode 426 of the organic light-emitting diode, and light is outputted through the emission portion EA.

At this time, a first passivation layer 415a, the organic light-emitting layer 430 and the second electrode 426 are not formed in the contact portions CA1 and CA2 outside the emission portion EA, and the contact electrodes 427 and 428 may be exposed to the outside.

At this time, although not shown in the figures, a second passivation layer of an organic material and a third passivation layer of an inorganic material may be formed in the emission portion EA so as to cover the organic light-emitting layer 430 and the second electrode 426.

As described above, the first electrode 416 including the first contact electrode 427 and the second contact electrode 428 are disposed on the substrate 410 of a transparent material. The substrate 410 may be formed of a rigid material such as glass. However, by using a material having flexibility such as plastic, it is possible to manufacture the lighting panel 300 which can be bent. Moreover, in the present disclosure, by using a plastic material having flexibility as the substrate 410, it is possible to perform a process using a roll, thereby manufacturing the lighting panel 400 quickly.

The first electrode 416 including the first contact electrode 427 and the second contact electrode 428 may be disposed in the emission portion EA and the first and second contact portions CA1 and CA2 and may be formed of a transparent conductive material having relatively high conductivity and high work function.

At this time, in the present disclosure, a short reduction pattern 417 is formed in the first electrode 416 for providing each pixel with currents to reflect a narrow path, and the first passivation layer 415a covers the short reduction pattern 417 to prevent occurrence of a short circuit. That is, the short reduction pattern 417 is formed so as to surround the periphery of an emission area of each pixel, and a resistance is added to each pixel, thereby limiting the currents flowing to a short-circuit occurrence region.

The first electrode 416 may extend to the first contact portion CA1 outside the emission portion EA and may constitute the first contact electrode 427. The second contact electrode 428 may be disposed in the second contact portion CA2 and may be electrically insulated from the first electrode 416. Namely, the second contact electrode 428 may be disposed in the same layer as the first electrode 416 and may be separated and electrically isolated from the first electrode 416.

An auxiliary electrode 411 may be disposed in the emission portion EA and the first contact portion CA1 on the substrate 410 and may be electrically connected to the first electrode 416 and the first contact electrode 427.

Like the first, second and third aspects of the present disclosure described above, the auxiliary electrode 411 is arranged in a shape of a mesh with a thin width, a hexagon, an octagon or a circle all over the emission portion EA such that uniform currents can be applied to the first electrode 416 all over the emission portion EA and the large area lighting panel 400 can emit light of uniform brightness.

FIG. 14 shows that the auxiliary electrode 411 is disposed under the first electrode 416 including the first contact electrode 427 and is embedded in the internal light extraction layer 440 and the buffer layer 401 up to a total thickness of the internal light extraction layer 440 and a part of a thickness of the buffer layer 401 as an example, but as stated above, the present disclosure is not limited thereto.

At this time, a portion corresponding to the rest of the thickness of the auxiliary electrode 411 may be filled with the first electrode 416.

Moreover, in FIG. 14, as an example, the auxiliary electrode 411 is embedded with a reversed taper in the internal light extraction layer 440 and the buffer layer 401, but the present disclosure is not limited thereto. The auxiliary electrode 411 may be embedded with a taper of substantially 90 degrees.

Like this, when the auxiliary electrode 411 is embedded in the internal light extraction layer 440 and the buffer layer 401, a step is not formed between the auxiliary electrode 411 and the upper layer, and it is prevented that the first passivation layer 415a to the third passivation layer and the second electrode 426 are cracked due to the step and taper of the related art auxiliary electrode. As a result, the effect of improving the reliability of the lighting panel can be provided.

At this time, the auxiliary electrode 411 disposed in the first contact portion CA1 is used as a transmission path for the currents to the first electrode 416 through the first contact electrode 427. The auxiliary electrode 411 may contact the outside and may serve as a contact electrode for applying currents from the outside to the first electrode 416.

The auxiliary electrode 411 may be formed of a conductive metal such as Al, Au, Cu, Ti, W, Mo or an alloy thereof. The auxiliary electrode 411 may have a two-layer structure of an upper auxiliary electrode and a lower auxiliary electrode, but the present disclosure is not limited thereto. The auxiliary electrode 411 may be formed of a single layer.

The first passivation layer 415a may be formed in the emission portion EA of the substrate 410. Like the first and second aspects of the present disclosure described above, the first passivation layer 415a may be removed in a light-emitting region and may be formed in a shape of a mesh so as to cover the auxiliary electrode 411, which is arranged in a shape of a mesh. However, the present disclosure is not limited thereto.

The first passivation layer 415a disposed in the emission portion EA may be formed to cover the auxiliary electrode 411 and the first electrode 416 thereon. The first passivation layer 415a is not formed in the light-emitting region where light is actually emitted.

The first passivation layer 415a may be formed of an inorganic material such as SiOx or SiNx. However, the first passivation layer 415a may be formed of an organic material such as photo acryl or may be composed of a plurality of layers of an inorganic material and an organic material.

In addition, the organic light-emitting layer 430 and the second electrode 426 may be disposed on the substrate 410 on which the first electrode 416 and the first passivation layer 415a are disposed. At this time, the first passivation layer 415a on the second contact electrode 428 in the emission portion EA may be partially removed and may have a contact hole 414 exposing the second contact electrode 428. Accordingly, the second electrode 426 may be electrically connected to the second contact electrode 428 thereunder through the contact hole 414.

The second electrode 426 may be formed of a material having relatively low work function such that electrons are easily injected to the organic light-emitting layer 430. Specific examples of a material used as the second electrode 426 may include a metal such as magnesium, calcium, sodium, titanium, indium, yttrium, lithium, gadolinium, aluminum, silver, tin and lead or an alloy thereof.

At this time, although not shown in the figures, the second passivation layer and the third passivation layer may be provided on the substrate 410 on which the second electrode 426 is formed.

The second passivation layer according to the fourth aspect of the present disclosure, as described above, may be formed to cover the organic light-emitting layer 430 and the second electrode 426 of the emission portion EA and may prevent moisture from penetrating into the organic light-emitting layer 430 of the emission portion EA.

The second passivation layer may be formed of an organic material such as photo acryl. In addition, the third passivation layer may be formed of an inorganic material such as SiOx or SiNx. However, the present disclosure is not limited thereto.

A predetermined encapsulant may be provided on the third passivation layer, and an epoxy compound, an acrylate compound, an acrylic compound, or the like may be used as the encapsulant.

An adhesive 418 such as PSA (pressure sensitive adhesive) is applied on the third passivation layer, the metal film 470 is disposed thereon, and the metal film 470 is attached to the third passivation layer, so that the lighting panel 400 can be encapsulated.

At this time, the adhesive 418 and the encapsulation member of the metal film 470 can be attached so as to sufficiently cover the second passivation layer and the third passivation layer.

In addition, a predetermined protection film 475 may be disposed thereon and attached to an entire surface of the emission portion EA of the substrate 410 excluding the contact portions CA1 and CA2.

The adhesive 418 may be a photo-curable adhesive or a thermosetting adhesive.

The present disclosure is not limited to the above first to fourth aspects. In the present disclosure, the structure on the auxiliary electrode may not be affected by a step formed due to the auxiliary electrode through embedding the auxiliary electrode in the buffer layer and/or the internal light extraction layer. That is, the embedding of the auxiliary electrode may decrease the size of the step, so that it is prevented that the passivation layers (i.e., the first, second and third passivation layers) and a cathode (i.e., the second electrode) are cracked due to a step and taper of the auxiliary electrode, thereby improving the reliability of the lighting panel. In addition, the embedding of the auxiliary electrode may cause the step to disappear, i.e., the first electrode has a planarized surface, so that it is prevented that the passivation layers (i.e., the first, second and third passivation layers) and a cathode (i.e., the second electrode) are cracked due to a step and taper of the auxiliary electrode, thereby improving the reliability of the lighting panel.

In some aspects of the present disclosure, the auxiliary electrode may be embedded up to a thickness of a buffer layer or be embedded up to a part of the thickness of the buffer layer, when the lighting panel includes the buffer layer but the inner light extraction layer. Moreover, the auxiliary electrode may be embedded up to a thickness of a buffer layer or be embedded up to a part of the thickness of the buffer layer, when the lighting panel includes the buffer layer and the inner light extraction layer. That is, even the inner light extraction layer is provided, the auxiliary electrode may only be provided in the buffer layer. Here, the auxiliary electrode may be embedded up to a thickness of a buffer layer refers to the thickness of the auxiliary electrode is similar as that of the buffer layer. The auxiliary electrode may be embedded up to a part of the thickness of the buffer layer refers to the thickness of the auxiliary electrode is less than that of the buffer layer, and an upper surface of the auxiliary electrode is flush with an upper surface of the buffer layer, an lower surface of the auxiliary electrode is flush with an lower surface of the buffer layer, or both of an upper surface and a lower surface of the auxiliary electrode are inside the buffer layer. In addition, in order to render the first electrode has a planarized surface, for example, an upper surface of the auxiliary electrode may be flush with an upper surface of the buffer layer, or a portion corresponding to a rest of the thickness of the buffer layer other than the part is filled with the first electrode.

In some aspects of the present disclosure, the auxiliary electrode may be embedded up to a thickness of the buffer layer, and is further embedded up to a thickness of the inner light extraction layer or a part of the thickness of the inner light extraction layer, when the lighting panel includes the buffer layer and the inner light extraction layer. In this case, an upper surface of the auxiliary electrode is flush with an upper surface of the buffer layer such that the first electrode has a planarized surface.

In some aspects of the present disclosure, the auxiliary electrode is embedded up to a part of a thickness of the buffer layer, and is further embedded up to a thickness of the inner light extraction layer or a part of the thickness of the inner light extraction layer, when the lighting panel includes the buffer layer and the inner light extraction layer. That is, an upper surface of the buffer layer is provided inside the buffer layer and a lower surface of the buffer layer is flush with a lower surface of the buffer layer, or both of an upper surface and a lower surface of the auxiliary electrode are inside of the buffer layer and the inner light extraction layer. In this case, a portion corresponding to a rest of the thickness of the buffer layer other than the part is filled with the first electrode such that the first electrode has a planarized surface.

In some aspects of the present disclosure, there is provided a lighting panel using an organic light-emitting diode, comprising: a material layer on a substrate; an auxiliary electrode embedded in the material layer; a first electrode on the material layer and electrically connected to the auxiliary electrode; an organic light-emitting layer and a second electrode in an emission portion where the first electrode is provided; and an encapsulation member in the emission portion of the substrate. Here, an upper surface of the material layer may be flush with an upper surface of the auxiliary electrode such that the first electrode has a planarized surface. In addition, the position of the first electrode in contact with the auxiliary electrode may be lower than an upper surface of the material layer. That is, the first electrode is filled on the auxiliary electrode such that the first electrode has a planarized surface. The material layer may include one or more layers of organic material and/or inorganic material. The one or more layers may include a buffer layer and/or an inner light extraction layer, and may further include other layers. The present disclosure is not limited thereto, the one or more layers may be other material layers in which a buffer layer and/or an inner light extraction layer are not included.

In some aspects of the present disclosure, there is provided a lighting module comprising the lighting panel according to any aspects of the present disclosure. Here, the lighting module is a semi-finished product that constitutes the final lighting device or lighting system.

In some aspects of the present disclosure, there is provided a lighting device comprising at least one of the lighting panel and the lighting module according to aspects of the present disclosure. Here, the lighting device may be a desk lamp, a wall lamp, a pendant lamp, a floor lamp, a street lamp, a portable lamp, a ceiling lamp, or a car lamp.

In some aspects of the present disclosure, there is provided a lighting system comprising at least one of the lighting panel, the lighting module and the lighting device according to aspects of the present disclosure. Here, the lighting system may further include a controlling device to control the lighting panel, the lighting module or the lighting device.

It will be apparent to those skilled in the art that various modifications and variations can be made in a device of the present disclosure without departing from the sprit or scope of the aspects. Thus, it is intended that the present disclosure covers the modifications and variations of this disclosure provided they come within the scope of the appended claims and their equivalents.

What is claimed is:

1. A lighting panel using an organic light-emitting diode, comprising:
    a material layer disposed on a substrate;
    an auxiliary electrode embedded in the material layer;
    a first electrode disposed on the material layer and electrically connected to the auxiliary electrode;
    an organic light-emitting layer and a second electrode disposed at an emission portion where the first electrode is located;
    an encapsulation member disposed on the emission portion of the lighting panel;
    a short reduction pattern indisposed at the first electrode and surrounding an emission area of each pixel of the lighting panel, and
    a first passivation layer between the first electrode and the organic light-emitting layer, wherein the first passivation layer covers the short reduction pattern and exposes the first electrode,
    wherein a distance between the first electrode exposed by the first passivation layer and the second electrode is smaller than a distance between the short reduction pattern covered by the first passivation layer and the second electrode,
    wherein the material layer includes a buffer layer,
    wherein the material layer further includes an inner light extraction layer between the substrate and the buffer layer,
    wherein the auxiliary electrode is embedded up to a thickness of the buffer layer, and is further embedded up to a thickness of the inner light extraction layer or a part of the thickness of the inner light extraction layer, and
    wherein an upper surface of the auxiliary electrode is flush with an upper surface of the buffer layer such that the first electrode has a planarized surface.

2. The lighting panel of claim 1, wherein an upper surface of the material layer is flush with or disposed higher than an upper surface of the auxiliary electrode.

3. The lighting panel of claim 1, wherein a position of the first electrode in contact with the auxiliary electrode is lower than an upper surface of the material layer.

4. A lighting panel using an organic light-emitting diode, comprising:
    a material layer disposed on a substrate;
    an auxiliary electrode embedded in the material layer;
    a first electrode disposed on the material layer and electrically connected to the auxiliary electrode;
    an organic light-emitting layer and a second electrode disposed at an emission portion where the first electrode is located;
    an encapsulation member disposed on the emission portion of the lighting panel;
    a short reduction pattern indisposed at the first electrode and surrounding an emission area of each pixel of the lighting panel, and
    a first passivation layer between the first electrode and the organic light-emitting layer, wherein the first passivation layer covers the short reduction pattern and exposes the first electrode,
    wherein a distance between the first electrode exposed by the first passivation layer and the second electrode is smaller than a distance between the short reduction pattern covered by the first passivation layer and the second electrode, wherein the material layer includes a buffer layer, wherein the material layer further includes an inner light extraction layer between the substrate and the buffer layer, wherein the auxiliary electrode is embedded up to a part of a thickness of the buffer layer, and is further embedded up to a thickness of the inner light extraction layer or a part of the thickness of the inner light extraction layer, and wherein a portion corresponding to a rest of the thickness of the buffer layer other than the part is filled with the first electrode such that the first electrode has a planarized surface.

5. The lighting panel of claim 1, wherein the auxiliary electrode does not protrude above the buffer layer.

6. The lighting panel of claim 1, wherein the auxiliary electrode has a reversed taper in cross-section such that an upper part of the auxiliary electrode has a wider width than a lower part of the auxiliary electrode.

7. The lighting panel of claim 1, wherein the first passivation layer further covers the auxiliary electrode and the first electrode thereon.

8. A lighting panel using an organic light-emitting diode, comprising:

a buffer layer disposed on a substrate;

an auxiliary electrode embedded in the buffer layer and arranged in a mesh shape at an emission portion of the lighting panel;

a first electrode disposed on the buffer layer and electrically connected to the auxiliary electrode for applying uniform current to the first electrode;

an organic light-emitting layer on the first electrode;

a second electrode disposed on the organic light-emitting layer;

a short reduction pattern disposed at the first electrode and surrounding an emission area of each pixel of the lighting panel, and a first passivation layer between the first electrode and the organic light-emitting layer, wherein the first passivation layer covers the short reduction pattern and exposes the first electrode, wherein a distance between the first electrode exposed by the first passivation layer and the second electrode is smaller than a distance between the short reduction pattern covered by the first passivation layer and the second electrode, wherein an inner light extraction layer is further disposed between the substrate and the buffer layer, wherein the auxiliary electrode is embedded up to a thickness of the buffer layer, and is further embedded up to a thickness of the inner light extraction layer or a part of the thickness of the inner light extraction layer, and wherein an upper surface of the auxiliary electrode is flush with an upper surface of the buffer layer such that the first electrode has a planarized surface.

9. The lighting panel of claim 8, wherein the auxiliary electrode has a reversed taper in cross-section such that an upper part of the auxiliary electrode has a wider width than a lower part of the auxiliary electrode.

10. The lighting panel of claim 8, wherein the first passivation layer further covers the auxiliary electrode and the first electrode thereon.

11. The lighting panel of claim 1, wherein the short reduction pattern has first, second, third, fourth and fifth parts, the first, second, third, fourth and fifth parts are sequentially and continuously connected to each other and the first and fifth parts are separated from each other, and wherein the first, third and fifth parts extend along a first direction, and the second and fourth parts extend along a second direction crossing the first direction, and wherein the first part is disposed between the third and fifth parts.

12. The lighting panel of claim 8, wherein the short reduction pattern has first, second, third, fourth and fifth parts, the first, second, third, fourth and fifth parts are sequentially and continuously connected to each other and the first and fifth parts are separated from each other, and wherein the first, third and fifth parts extend along a first direction, and the second and fourth parts extend along a second direction crossing the first direction, and wherein the first part is disposed between the third and fifth parts.

13. The lighting panel of claim 1, wherein a width of the short reduction pattern is smaller than a width of the first electrode.

14. The lighting panel of claim 8, wherein a width of the short reduction pattern is smaller than a width of the first electrode.

\* \* \* \* \*